(12) United States Patent
Guo

(10) Patent No.: US 10,954,598 B2
(45) Date of Patent: Mar. 23, 2021

(54) HIGH THROUGHPUT VACUUM DEPOSITION SOURCES AND SYSTEM

(71) Applicant: Ascentool, Inc., Palo Alto, CA (US)

(72) Inventor: George Xinsheng Guo, Palo Alto, CA (US)

(73) Assignee: George Xinsheng Guo, Palo Alto, CA (US)

( * ) Notice: Subject to any disclaimer, the term of this patent is extended or adjusted under 35 U.S.C. 154(b) by 445 days.

(21) Appl. No.: 15/901,145

(22) Filed: Feb. 21, 2018

(65) Prior Publication Data

US 2018/0245217 A1    Aug. 30, 2018

Related U.S. Application Data

(60) Provisional application No. 62/465,018, filed on Feb. 28, 2017.

(51) Int. Cl.
| | | |
|---|---|---|
| *C23C 14/35* | (2006.01) | |
| *C23C 16/458* | (2006.01) | |
| *C23C 16/513* | (2006.01) | |
| *C23C 16/46* | (2006.01) | |
| *C23C 16/04* | (2006.01) | |
| *C23C 16/50* | (2006.01) | |
| *C23C 16/455* | (2006.01) | |
| *H01J 37/34* | (2006.01) | |
| *H01J 37/32* | (2006.01) | |
| *C23C 14/04* | (2006.01) | |

(52) U.S. Cl.
CPC ........ *C23C 16/4587* (2013.01); *C23C 14/044* (2013.01); *C23C 14/352* (2013.01); *C23C 16/04* (2013.01); *C23C 16/042* (2013.01); *C23C 16/45563* (2013.01); *C23C 16/46* (2013.01); *C23C 16/50* (2013.01); *C23C 16/513* (2013.01); *H01J 37/32715* (2013.01); *H01J 37/32743* (2013.01); *H01J 37/32779* (2013.01); *H01J 37/32899* (2013.01); *H01J 37/345* (2013.01); *H01J 37/3417* (2013.01); *H01J 37/3423* (2013.01); *H01J 37/3435* (2013.01); *H01J 37/3447* (2013.01)

(58) Field of Classification Search
CPC .................................................. C23C 14/352
See application file for complete search history.

(56) References Cited

U.S. PATENT DOCUMENTS

| | | | |
|---|---|---|---|
| 5,433,835 A | 7/1995 | Demaray | |
| 5,814,196 A | 9/1998 | Hollars | |
| 6,869,484 B2 * | 3/2005 | Hunt | .................... C23C 16/4412 118/718 |

(Continued)

*Primary Examiner* — Jason Berman
(74) *Attorney, Agent, or Firm* — SV Patent Service

(57) ABSTRACT

A high throughput deposition apparatus includes a process chamber, a plurality of targets that form a first closed loop in the process chamber, wherein the first closed loop includes a long dimension defined by at least a first pair of targets and a short dimension defined by at least a second pair of targets, a first substrate carrier assembly that can hold one or more substrates and configured to receive a deposition material from the plurality of targets in the first closed loop, and a transport mechanism that can move the first substrate carrier assembly along an axial direction through the first closed loop in the first process chamber.

16 Claims, 30 Drawing Sheets

(56) References Cited

U.S. PATENT DOCUMENTS

| | | | |
|---|---|---|---|
| 2002/0066669 A1* | 6/2002 | Kadokura | H01J 37/3405 |
| | | | 204/298.18 |
| 2007/0045108 A1 | 3/2007 | Demaray | |
| 2007/0199817 A1* | 8/2007 | Guo | H01J 37/3408 |
| | | | 204/298.16 |
| 2008/0121514 A1 | 3/2008 | Guo | |
| 2008/0241409 A1* | 10/2008 | Guo | H01J 37/3435 |
| | | | 427/421.1 |
| 2014/0102889 A1* | 4/2014 | Kajihara | C23C 14/3464 |
| | | | 204/298.11 |
| 2016/0093478 A1 | 3/2016 | Guo | |
| 2017/0047205 A1* | 2/2017 | Teer | H01J 37/3417 |

* cited by examiner

HIGH THROUGHPUT VACUUM DEPOSITION SOURCES AND SYSTEM

BACKGROUND OF THE INVENTION

The present application relates to material deposition technologies, and more specifically to high throughput deposition apparatus.

Material deposition in vacuum is widely used in photovoltaic cells and panels, window glass coating, flat panel display manufacturing, coating on flexible substrates, hard disk coating, industrial surface coating, semiconductor wafer processing, and other applications.

High volume production systems used for these applications typically comprise of interconnected box-shaped chambers that accept one or two rows of substrates where one or two sets of deposition sources are mounted on each sides of the vacuum chamber. The deposition sources include chemical vapor deposition (CVD) and sputtering deposition. Sputtering typically has a material usage rates ranging from 20 percent for low cost planar targets to 80% for high cost rotary targets for sputtering deposition.

In some conventional sputtering deposition systems, the sputtering sources need to be larger than the substrate to achieve good uniformity across the whole substrate, causing wasted deposition material outside the substrate and excess material deposition on either the deposition chamber or deposition shields. The need to change deposition shields to avoid particulate formation is one of the major causes for preventive maintenance (PM) and loss of production time. To compensate for finite size of a sputtering target, more materials must come out from edge of the target to achieve good thickness uniformity, causing deeper erosion near target edge and low target utilization. The plasma density and angular distribution of atoms of the target material arriving at the substrate are intrinsically non-uniform. Magnets mounted behind the target are used to enhance the plasma density. The magnets consist of alternating north and south poles, which produce magnetic fluxes lines spanning from target surface to reach the substrate. Electrons from the target or near the target gain energy due to the electric potential established by the target voltage, follow these magnetic flux lines, and bombard the substrate. The energetic electrons can damage the substrate and are non-uniform across substrate surface.

In some conventional plasma enhanced chemical vapor deposition systems (PECVD), gas distribution plate with perforated holes are placed in parallel next to the substrate. Radio frequency (RF) power is connected to the gas distribution plate to create plasma to enhance the deposition rate. The typical vacuum pressure is kept in a range between 0.1 to 10 Torr in order to sustain plasma, and the plasma density is typically low. The low plasma density limits the deposition rate and requires high voltage on gas distribution plate. The high operating pressure causes excessive gas phase reaction and reduced material utilization.

There is therefore a need for higher throughput deposition systems that can provide uniform deposition, reduce plasma damage, widen process window, increase throughput, provide higher productivity, provide higher material utilization, reduce material deposition outside substrate, increase time between maintenance, lower target cost, and lower equipment cost.

SUMMARY OF THE INVENTION

The present application discloses a high throughput deposition apparatus that reduces equipment cost, improves deposition uniformity, increases number of the substrates in processing chamber, reduces waste of deposition materials, and provides high throughput substrate processing. The operation up time is improved by reducing the need or frequencies of replacing deposition materials and deposition shields.

Traditional in-line deposition systems consist of connected box shaped vacuum chamber with one or two rows of substrates or substrate carriers moving through the deposition system and receiving deposition materials from deposition sources mounted on either side or both sides of the deposition system. Each deposition source only faces one row of substrates at a time. In the present invention, the deposition source forms a three-dimensional closed loop and two rows of substrates placed back-to-back pass through the source, doubling the system throughput for each source. A three-dimensional closed loop source only has a single closed loop magnetic field to confine the electrons and enhance the plasma, which is significantly more uniform than traditional closed loop on planar or cylindrical surfaces in which electrons have to make sharp turns near target edge. The presently disclosed system can deposit materials in 360 degrees for intrinsically uniform deposition. A single closed-loop magnet assembly can produce magnetic fields substantially parallel to the target surface, avoiding direct magnetic flux, preventing high energy electrons to reach substrates, and enabling better target erosion uniformity and target utilization.

In the present invention, deposition sources are mounted inside a deposition chamber. In one implementation, two rows of substrates can be deposited back to back at a time. The number of deposition sources and substrates are not limited to two rows. For example, there can be 4, 6, 8 . . . rows of substrates mounted back to back on 2, 3, 4 . . . rows of substrate carriers. The throughput is greatly increased.

In one aspect, a cylindrical vacuum envelope can be used because it can stand a larger pressure difference than a box vacuum envelope, and thus can use thinner walls to hold vacuum pressure, which is cheaper to manufacture. Fewer welds for a cylindrical chamber are required than a box shaped chamber, further reducing cost. It should be noted that conventional deposition systems are constructed with planar or rotary sources and targets. The sources are mounted to a flat surface, which are compatible with rectangular shaped chambers rather than cylindrical chambers.

In one general aspect, the present invention relates to a high throughput deposition apparatus, that includes a process chamber; a plurality of targets that form a first closed loop in the process chamber, wherein the first closed loop includes a long dimension defined by at least a first pair of targets and a short dimension defined by at least a second pair of targets; a first substrate carrier assembly that can hold one or more substrates and receive a deposition material from the plurality of targets in the first closed loop; and a transport mechanism that can move the first substrate carrier assembly along an axial direction through the first closed loop in the first process chamber.

Implementations of the system may include one or more of the following. The targets can have tapered shape along an edge along the first closed loop. The one or more of substrates can have one or more planar deposition surfaces that can receive the deposition material, wherein the one or more planar deposition surfaces are parallel to the long dimension of the first closed loop. The first substrate carrier assembly can include a plurality of clamps; and a pair of substrates that are clamped back-to-back by the plurality of clamps, wherein the pair of substrates comprise opposing surfaces that can receive the deposition material from the plurality of targets in the first closed loop. The first substrate carrier assembly can include a heater plate that can heat the one or more substrates. The first substrate carrier assembly can include a first substrate comprising opposing surfaces that can receive the deposition material from the plurality of targets in the first closed loop. The transport mechanism can include wheels mounted under the first substrate carrier assembly and configured to roll along the axial direction. The first substrate carrier assembly further comprises a cushion material under the one or more of substrates and over the wheels. The first closed loop can define a plane that is perpendicular to the axial direction. The high throughput deposition apparatus can further include a plurality of targets that form a second closed loop in the process chamber, wherein the second closed loop includes a long dimension defined by at least a third pair of targets and a short dimension defined by at least a fourth pair of targets; a second substrate carrier assembly that can hold a single or a plurality of substrates and configured to receive a deposition material from the plurality of targets in the second closed loop, wherein the transport mechanism can move the second substrate carrier assembly along the axial direction through the second closed loop in the first process chamber. The first and second substrate carrier assemblies follow different tracks that are substantially parallel to each other. The throughput of the system can be doubled by placing two sets of deposition sources, two sets of substrate carrier assemblies, and two sets of tracks. The second substrate carrier assembly can include a plurality of clamps; and a pair of substrates that are clamped back-to-back to by the plurality of clamps. The high throughput deposition apparatus can further include: a cluster of deposition shields mounted on a shaft positioned adjacent to the plurality of targets in the first closed loop in the process chamber; and a rotation mechanism that can rotate the shaft to allow different one of deposition shields in the cluster to block a portion of the deposition material from the plurality of targets. The high throughput deposition apparatus can further include a plurality of magnets that form a third closed loop in the process chamber, wherein the plurality of magnets are positioned outside the first closed loop formed by a plurality of targets. The high throughput deposition apparatus can further include a backing plate mounted to targets; an elastic seal between the backing plate and the plurality of targets; and a channel between the plurality of targets and the backing plate, the channel that can transport gas to cool the plurality of targets.

In another general aspect, the present invention relates to a high throughput deposition apparatus, that includes: a process chamber; a plurality of deposition sources that form a first closed loop in the process chamber; a first substrate carrier assembly that can hold one or more substrates and configured to receive a deposition material from the plurality of deposition sources in the first closed loop, wherein the deposition sources can produce vapor for chemical vapor deposition (CVD) or plasma enhanced chemical vapor deposition (PECVD); and a transport mechanism that can move the first substrate carrier assembly along an axial direction through the first closed loop in the first process chamber.

These and other aspects, their implementations and other features are described in details in the drawings, the description and the claims.

BRIEF DESCRIPTION OF THE DRAWINGS

FIG. 6A shows a perspective view of such system; FIG. 6B shows such system with vacuum chamber envelopes removed for clarity; FIG. 6C shows the details of a load lock; and FIG. 6D shows the deposition sources and two rows of substrate carriers.

DETAILED DESCRIPTION OF THE INVENTION

Figure 1A:
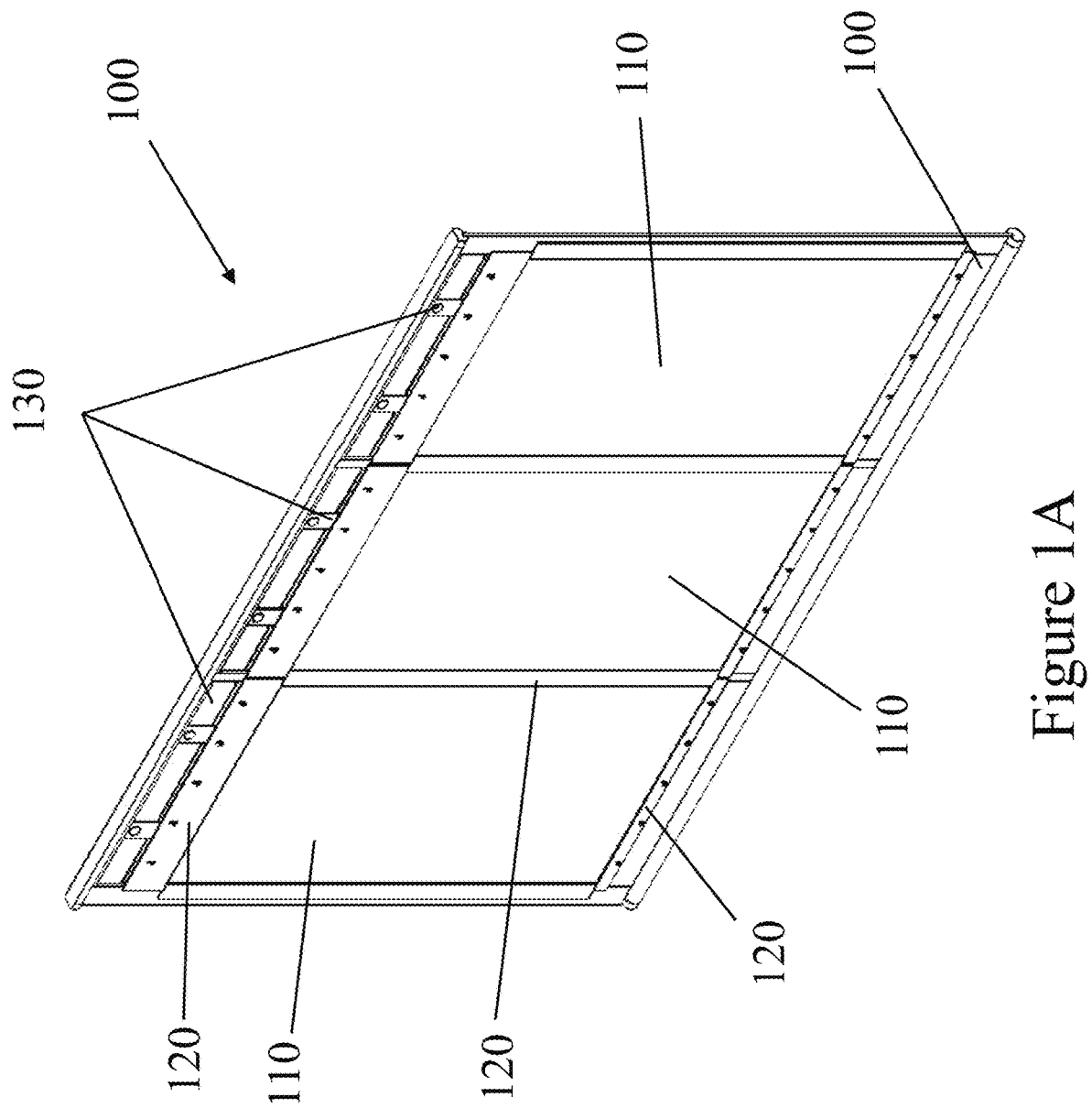
FIG. 1A is a perspective view of a substrate carrier with multiple substrates placed on both sides of an optional heater in accordance with the present invention.
Figure 1B:
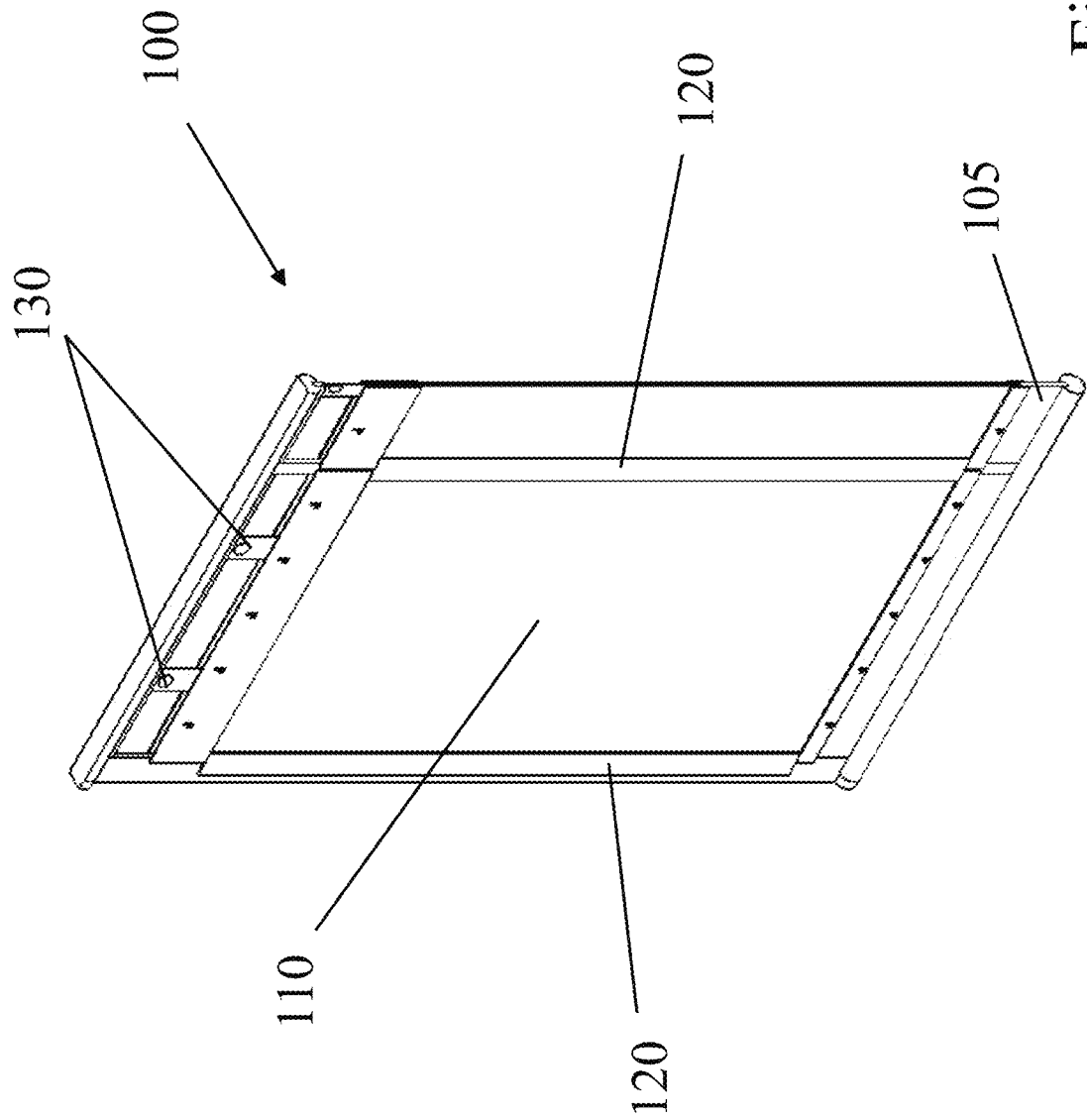
FIG. 1B is a cutout perspective view of the substrate carrier in FIG. 1A.
Figure 1C:
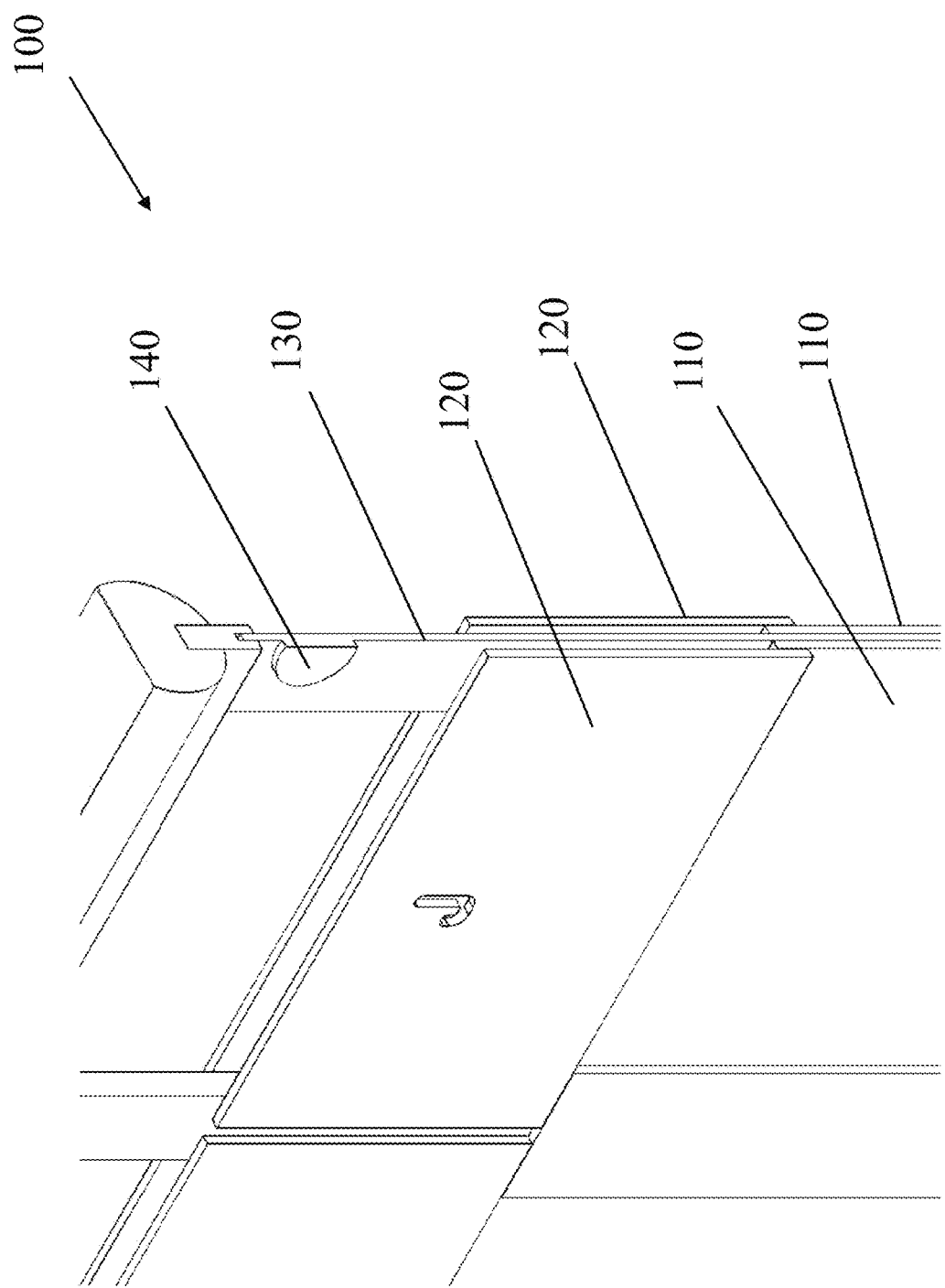
FIG. 1C is the detailed view of the top portion of the substrate carrier in FIG. 1B.

In the present invention, the substrates such as glass, silicon wafers, or other substrates are attached to a substrate carrier. The substrates are clamped to the substrate holder with the back of substrates surface facing each other, or facing an optional heater or an optional mounting plate. The surfaces to be deposited are facing outward. FIGS. 1A-1D show prospective views of a substrate carrier assembly 100. Shown in FIG. 1A, the substrate carrier 100 assembly includes six substrates 110 mounted on a frame 105. The three pairs of the substrates 110 are clamped by clamps 120 back-to-back to thin heaters 130. FIG. 1B shows a cutout section of the substrate carrier assembly 100. FIG. 1C shows the upper portions of the substrate carrier assembly 100. Two (glass) substrates 110 are held by clamps 120 against the thin heater 130. The thin heater 130 has the electrical connections outside the substrate area 140. The heater contact area 140 can be an exposed conductor pad, or a conductive wire that connects to the frame 105. The electrical connections can be made by pressing a conductive rod to the connector, or the heater connectors are attached to upper and lower rail, which are electrically insulated from each other. The upper and lower rails are pressed against moving mechanisms in the deposition systems. The moving mechanisms can be connected to electrical power. These heaters are commercially available and can heat the substrate up to 1000° C. Alternatively, the heater 130 can be resistive wires attached between upper and lower rail.

Figure 1D:
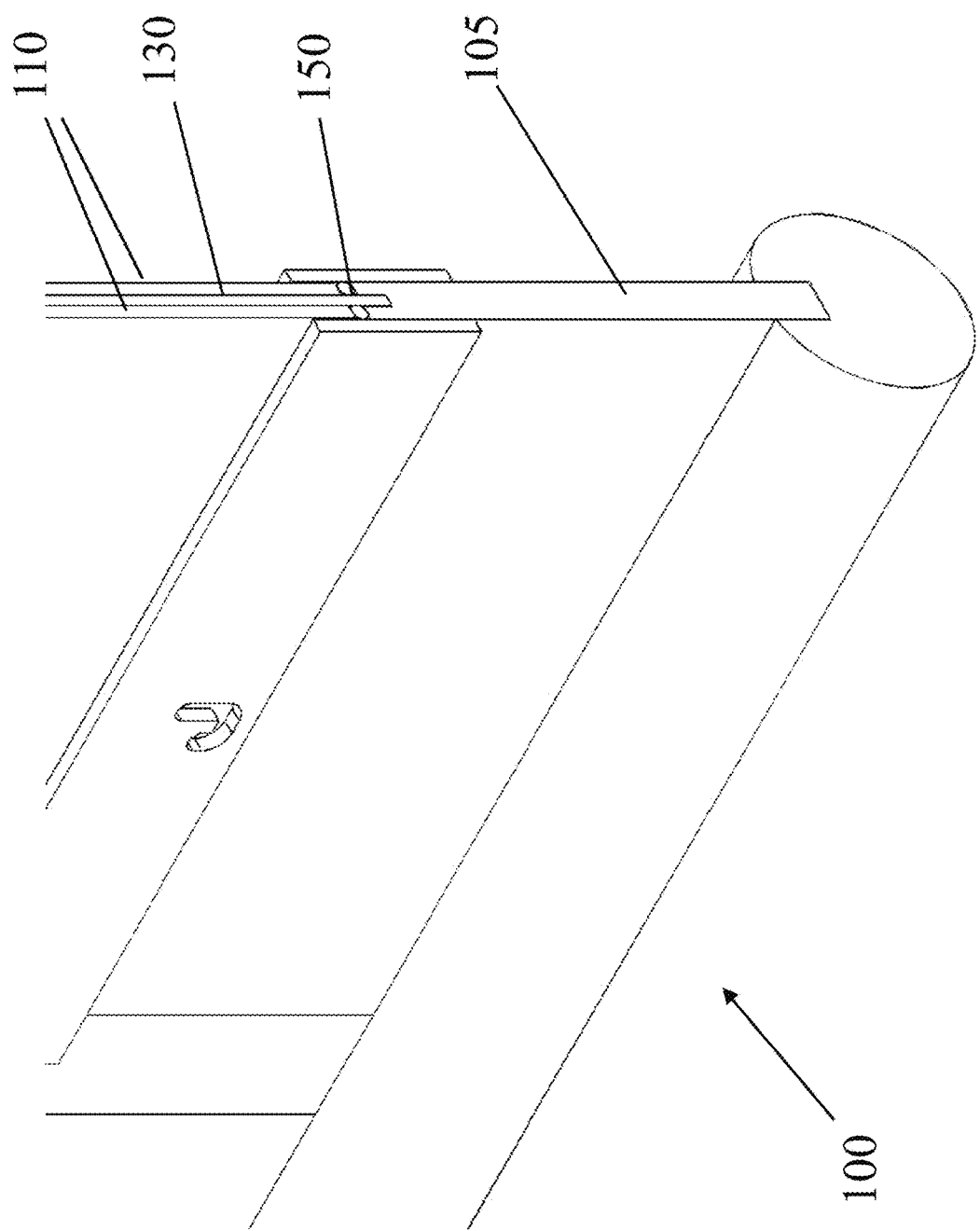
FIG. 1D is the detailed view of the bottom portion of the substrate carrier in FIG. 1B.

FIG. 1D shows the lower portion of the substrate carrier assembly 100, the substrate 110, the heater 130, and an optional cushion material 150 for releasing stress. The substrates 110 are placed on the cushion material 150 to release stress and to dampen the shocks during movement. The cushion material 150 can be made of high temperature polymer material such as Teflon, Kalrez, Kapton, or metal springs.

In some embodiments, the substrate carrier assembly 100 includes a substrate 110 that includes two deposition surfaces on opposing sides, which are both exposed to the targets for double-sided deposition. In other embodiments, the substrates can be placed directly on to the moving mechanism either by itself or back to back without a frame.

The configuration in FIGS. 1A-1D has the advantages of mounting twice as many substrates as a conventional single side carrier, absorbing the maximum amount of energy from the heater, and reducing both the stress points and shocks the substrates encounter. If both sides of substrates need to be deposited, one set of substrates are mounted to a mounting plate. For larger substrates, one substrate or two substrates can be moved on the moving mechanism in the deposition system without a carrier.

Figure 2A:
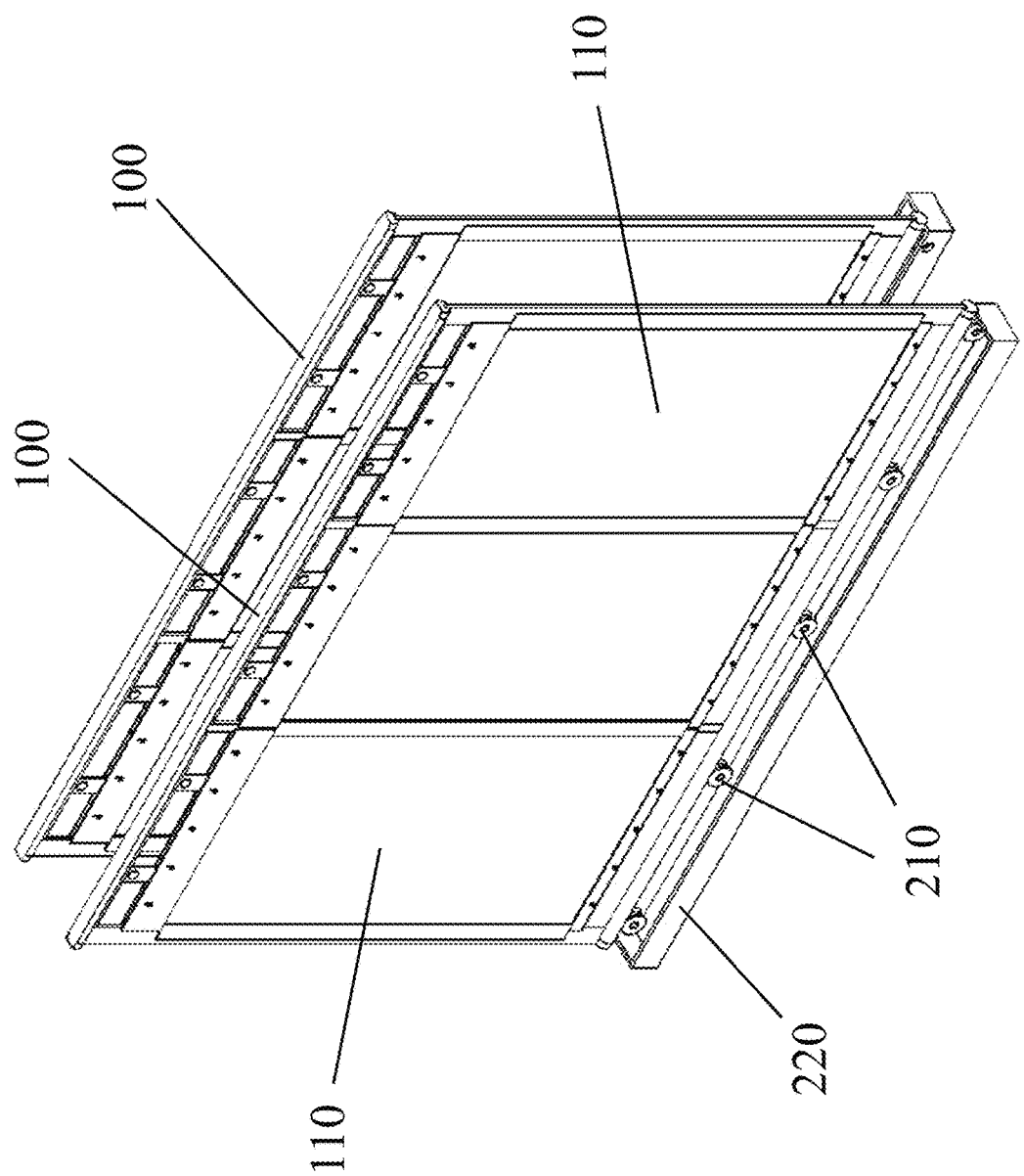
FIGS. 2A-2B illustrate two substrate carriers separated by a gap, compatible with the disclosed high throughput deposition apparatus, respectively in perspective and end views.
Figure 2B:
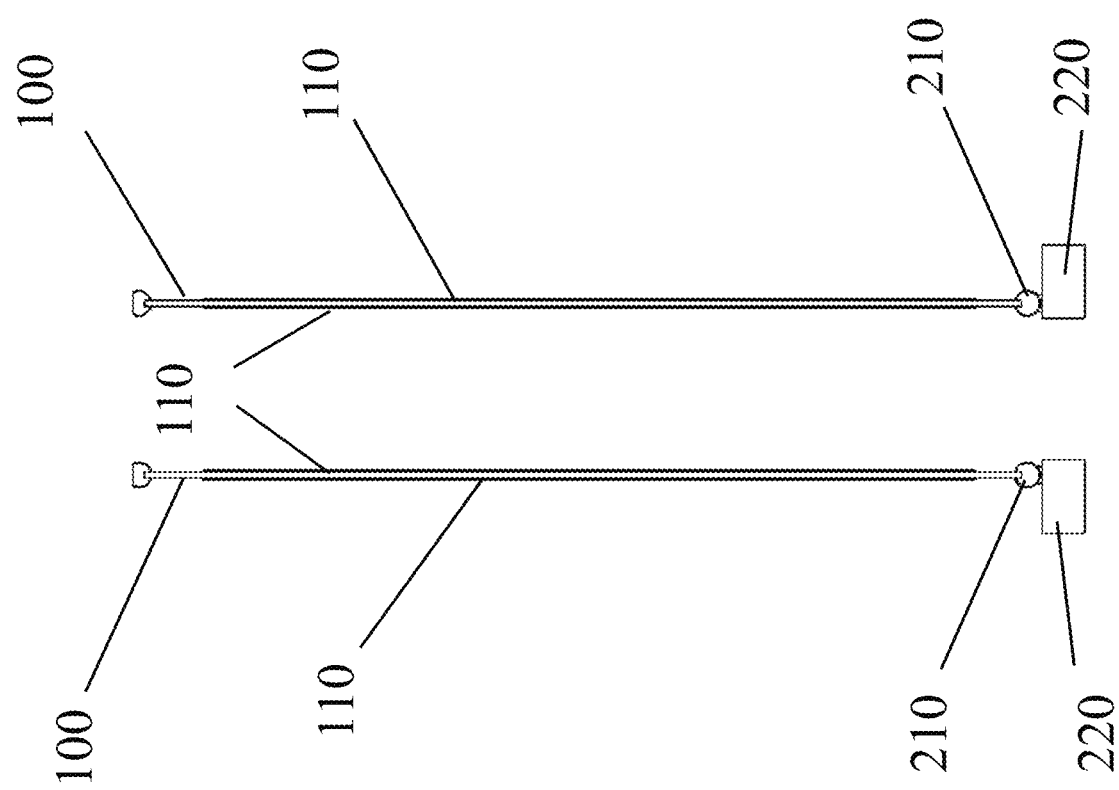

Referring to FIGS. 2A and 2B, the substrate carrier assembly 100 can be moved into a vacuum system by wheels 210 or other means on a rail 220. The wheels 210 near the bottom of the carriers support the substrate carriers and the upper portions of the substrate or substrate carrier can be guided by wheels or other means to maintain their positions. The wheels 210 can be implemented in many configurations. The movement of these wheels 210 transports the substrate carrier assembly 100. The top portion of the substrate carrier assembly 100 can include supporting wheels, magnetic force, or cam followers (not shown in FIGS. 2A and 2B) to maintain the upright position of the carriers. The wheels underneath the carrier move the carrier into the vacuum chamber or between vacuum chambers. Chamber vacuum envelope and isolation valves between vacuum chamber and atmosphere and between chambers are not shown here.

Two or more main substrate carrier assemblies 100 can be moved to and between each vacuum chamber at a time, increasing the vacuum system processing capabilities. The increase in cost of the vacuum system is relative small since the material used to make the vacuum chamber wider is limited compared to a narrower chamber. All the substrate carrier assemblies 100 in the same vacuum chamber can be transferred at same time to minimize the transfer time.

Figure 3A:
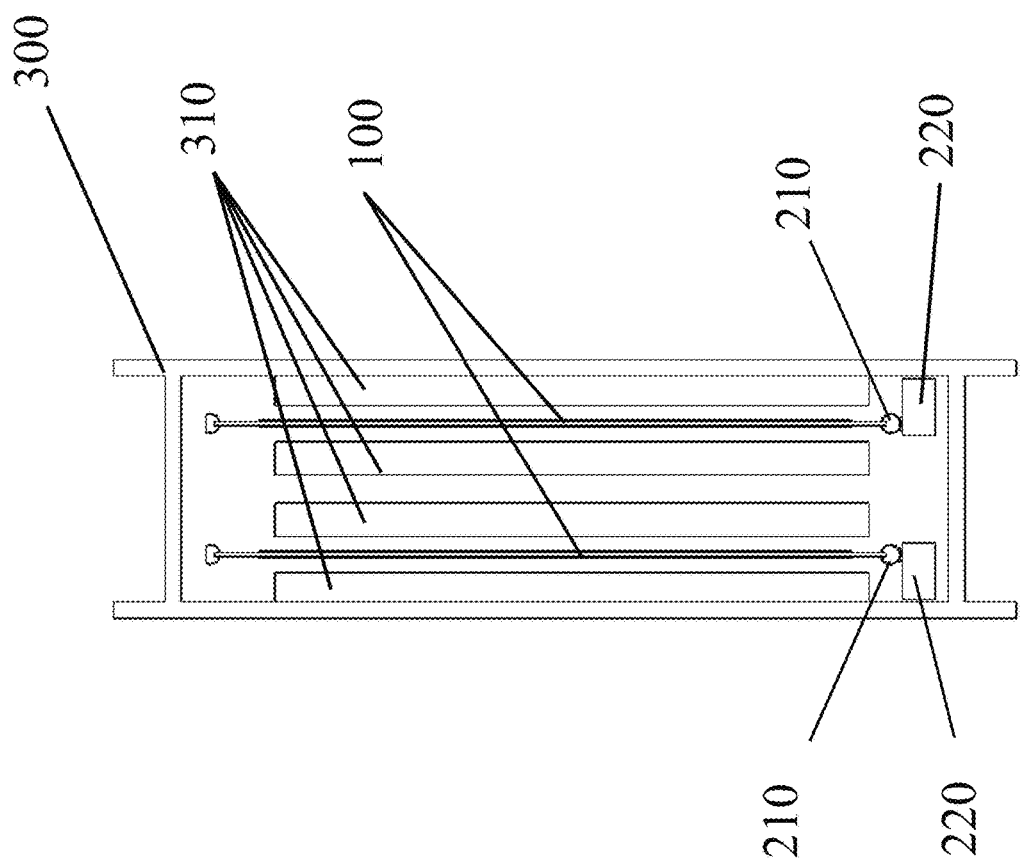
FIGS. 3A-3B are respectively end and perspective views illustrating two substrate carriers placed in a boxed load lock or a vacuum chamber with exemplified transport mechanisms for the substrate carriers compatible with the disclosed high throughput deposition apparatus.
Figure 3B:
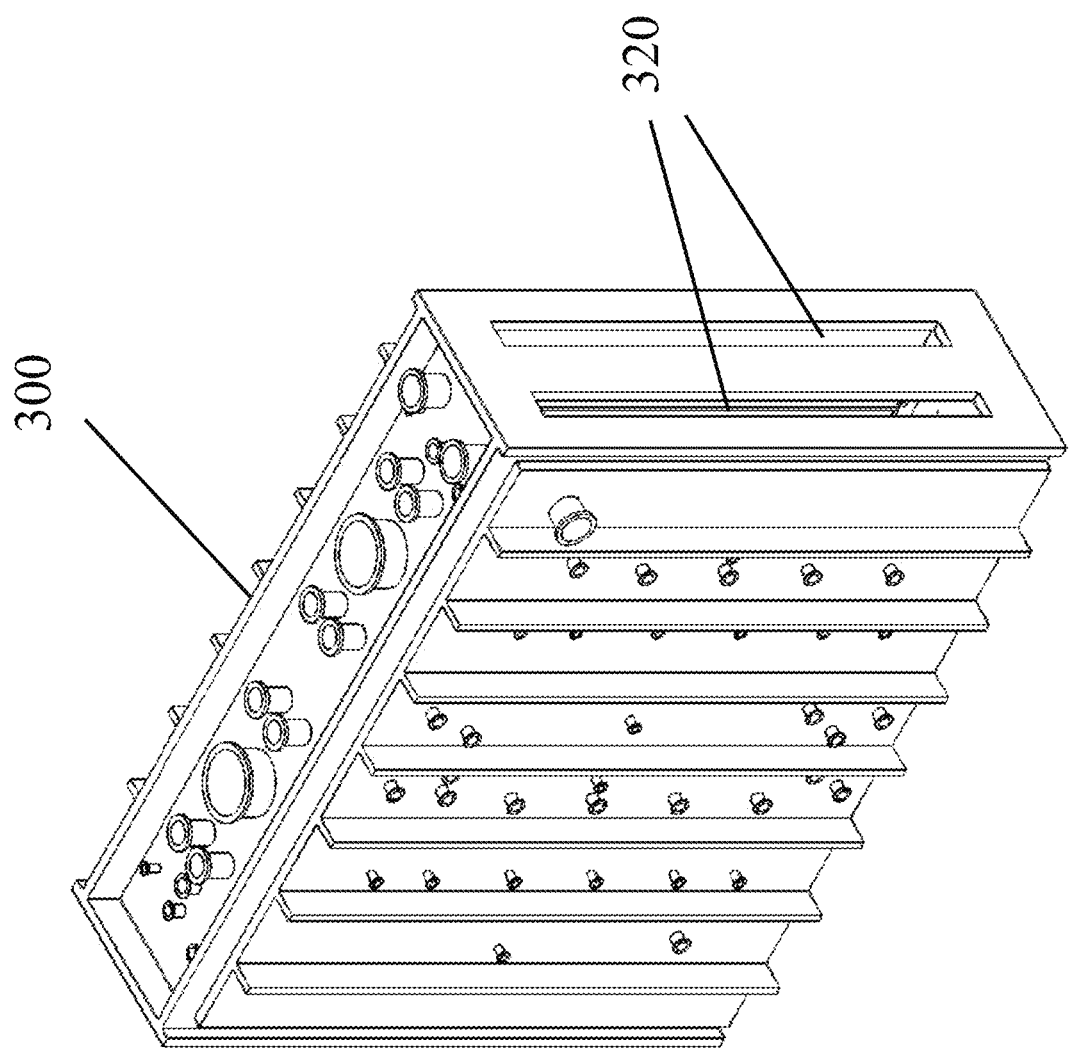

FIGS. 3A and 3B show two main substrate carrier assemblies 100 inside a box shaped vacuum chamber 300. To enter a high throughput vacuum deposition system, substrate carrier assemblies 100 are placed inside a load lock. The load lock is pumped to low pressure before the substrate carrier assemblies are moved into the deposition system. The load lock is then vented back to atmosphere pressure to receive next sets of substrate carrier assemblies. To reduce the pumping and venting time, a small chamber volume is desirable. The box-shaped vacuum chamber 300 or multiple box chambers each contains a single main substrate carrier is desirable even if box vacuum chamber cost more than a cylindrical vacuum chamber.

Heaters, deposition sources 310 such as Chemical Vapor Deposition (CVD) or Physical Vapor Deposition (PVD), or etching sources can be placed to face both sides of the substrate carrier assemblies 100 to carry out heating, material deposition or material removal. FIG. 3A shows the vacuum processing system with necessary heaters, deposition or etch sources. FIG. 3B shows the prospective view of the vacuum chamber from outside showing slits 320 for transporting the substrate carrier assemblies 100 in and out of the box-shaped vacuum chamber 300. For plasma sources, the electrical power can be applied between two opposing sources or applied individually to each source.

Figure 4A:
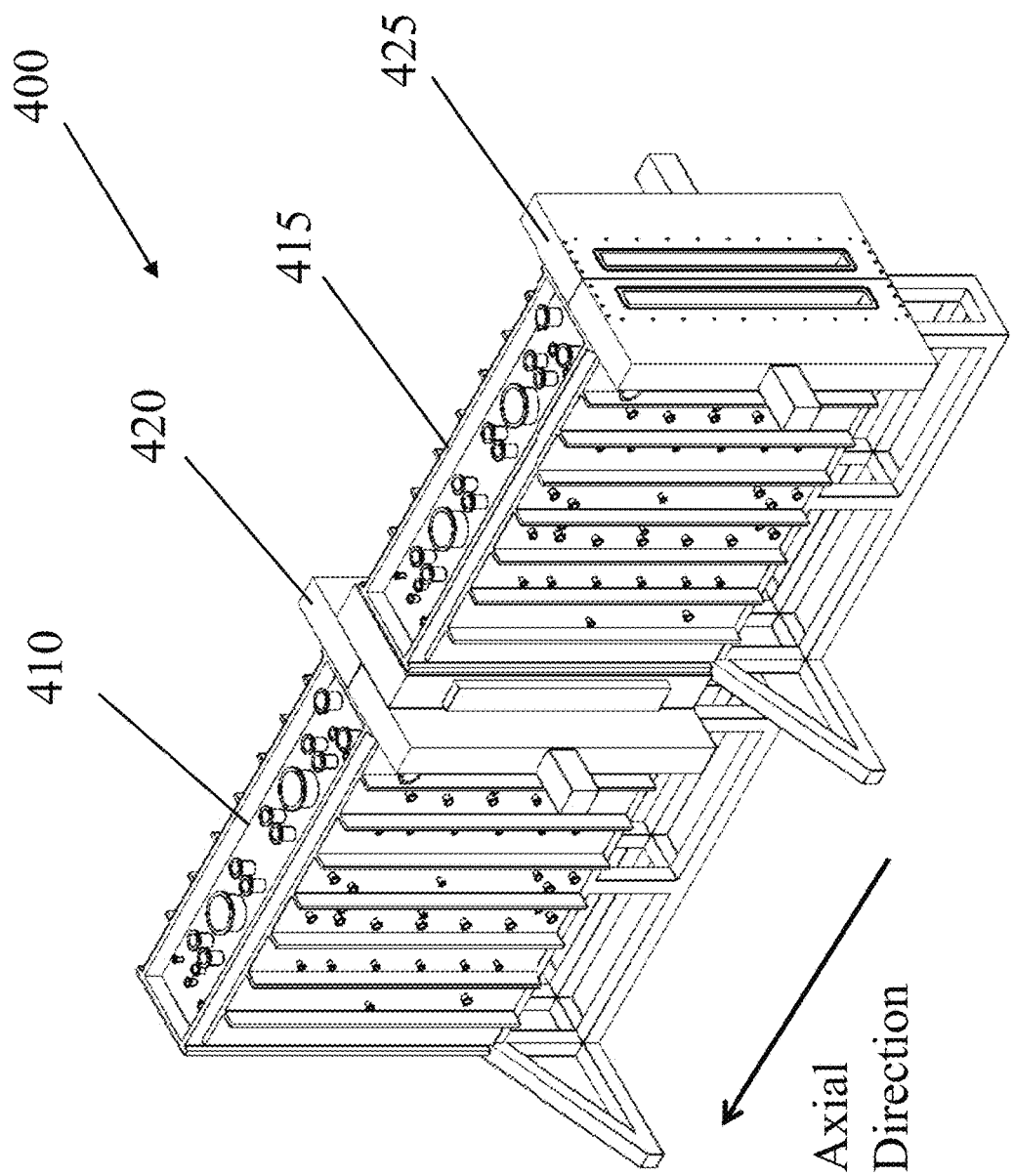
FIG. 4A illustrates two load lock chambers and two vacuum chambers connected to each other to form a high throughput deposition apparatus.
Figure 4B:
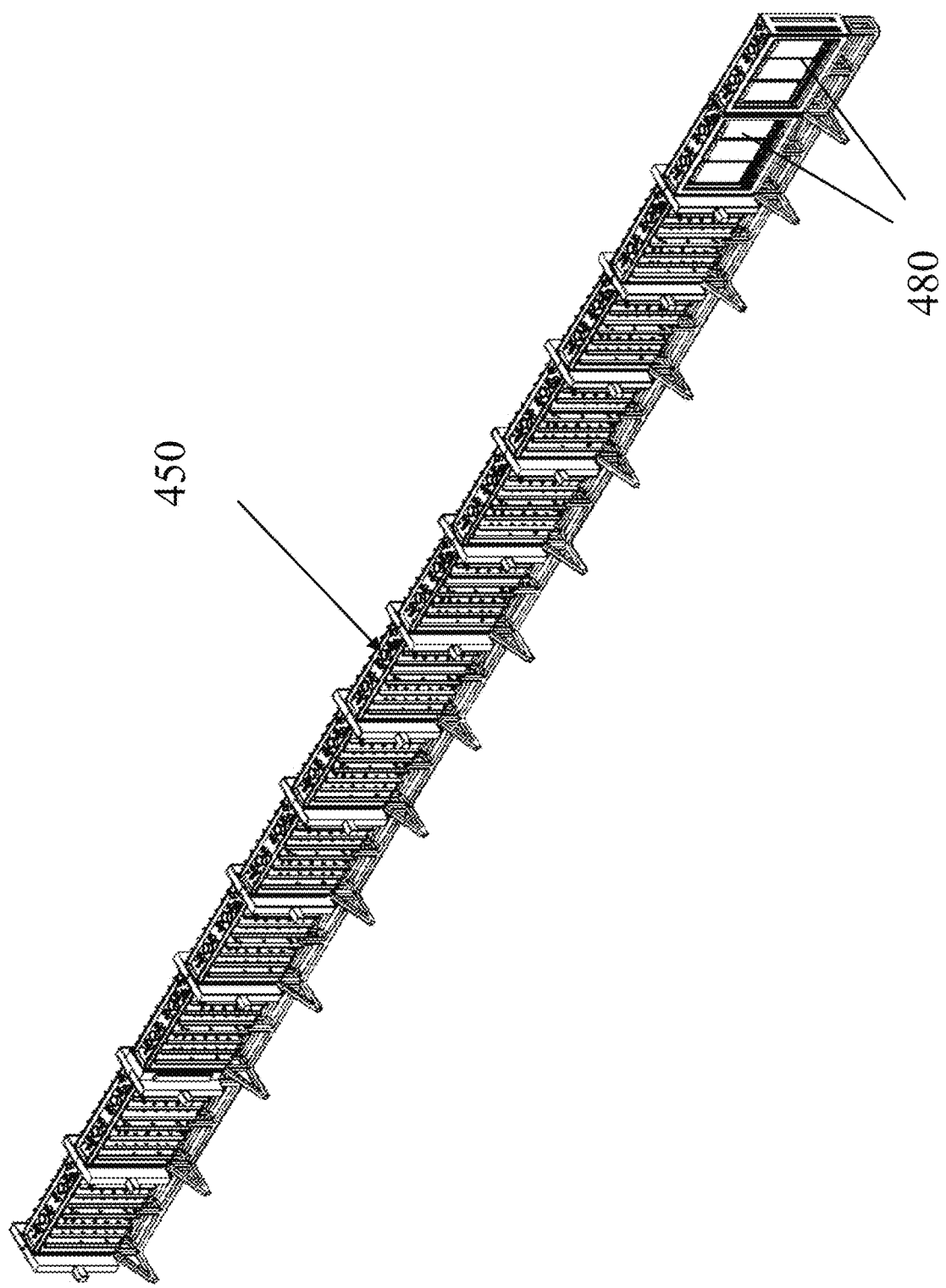
FIG. 4B illustrates multiple load lock chambers and multiple vacuum chambers connected to each other to form a high throughput deposition apparatus.

By connecting multiple vacuum chambers and isolation valves, a vacuum deposition or processing system can be formed. FIG. 4A shows a deposition system 400 comprising two vacuum deposition chambers 410, 415 and two isolation valves 420, 425 connected along the axial direction. FIG. 4B shows a deposition system 450 with 12 vacuum deposition chambers and two atmosphere chambers 480 for heating the substrates at atmospheric pressure. The deposition system 450 can be used to deposit large amount of substrates such as photovoltaic solar panels. The axial direction is parallel to the substrate movement direction.

Figure 5:
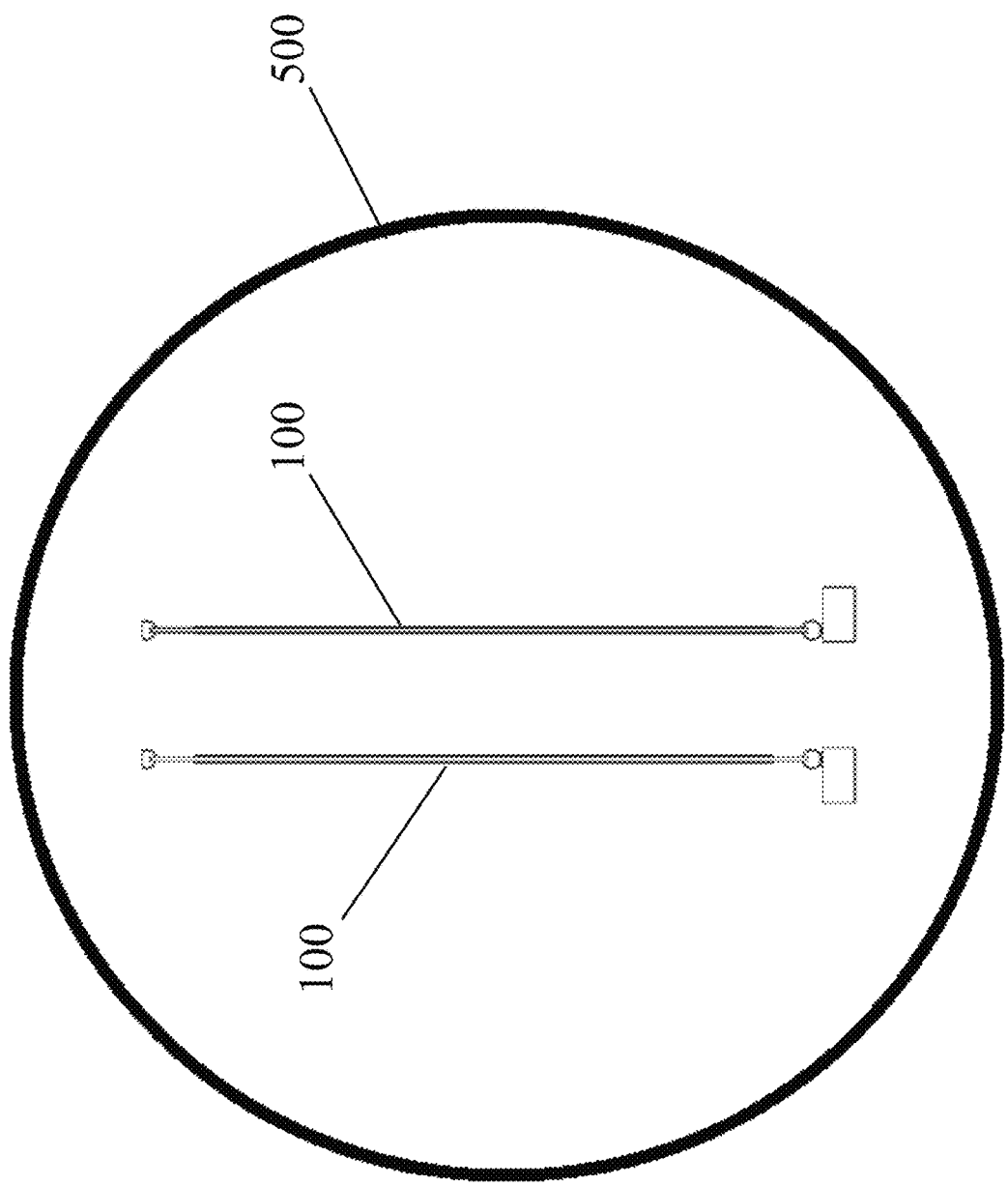
FIG. 5 illustrates an end view of two substrate carriers inside a cylindrical vacuum chamber.

Cylindrical vacuum envelope stands vacuum pressure much better than box envelopes using less wall thickness, requires fewer welds, and is cheaper to manufacture. FIG. 5 shows a box-shaped vacuum chamber 300 in FIG. 3A replaced by a cylindrical vacuum chamber.

Figure 6A:
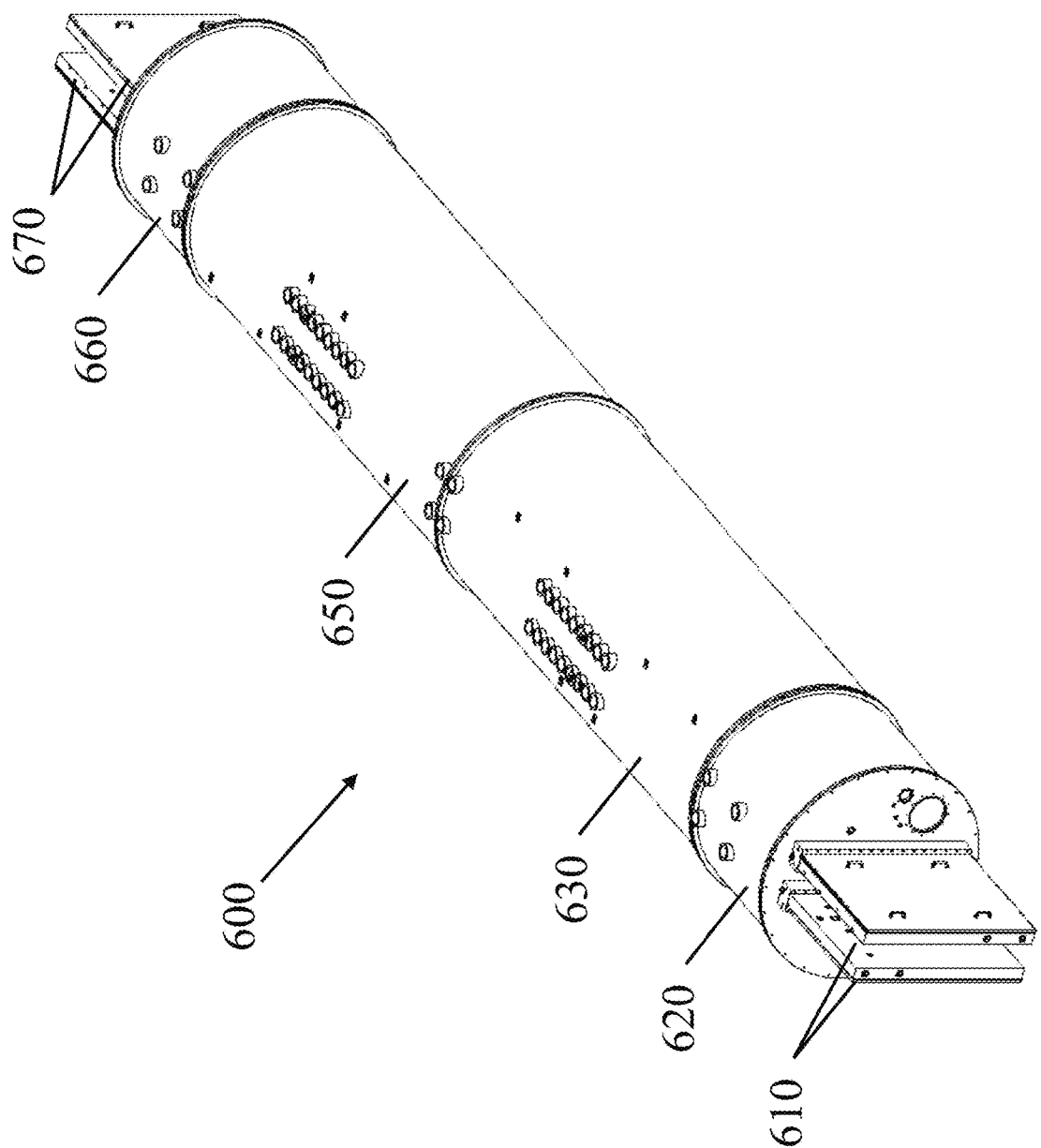
FIGS. 6A-6D illustrate an in-line deposition system comprising two rows of substrate carriers that are transported through boxed load locks and cylindrical vacuum chambers.
Figure 6B:
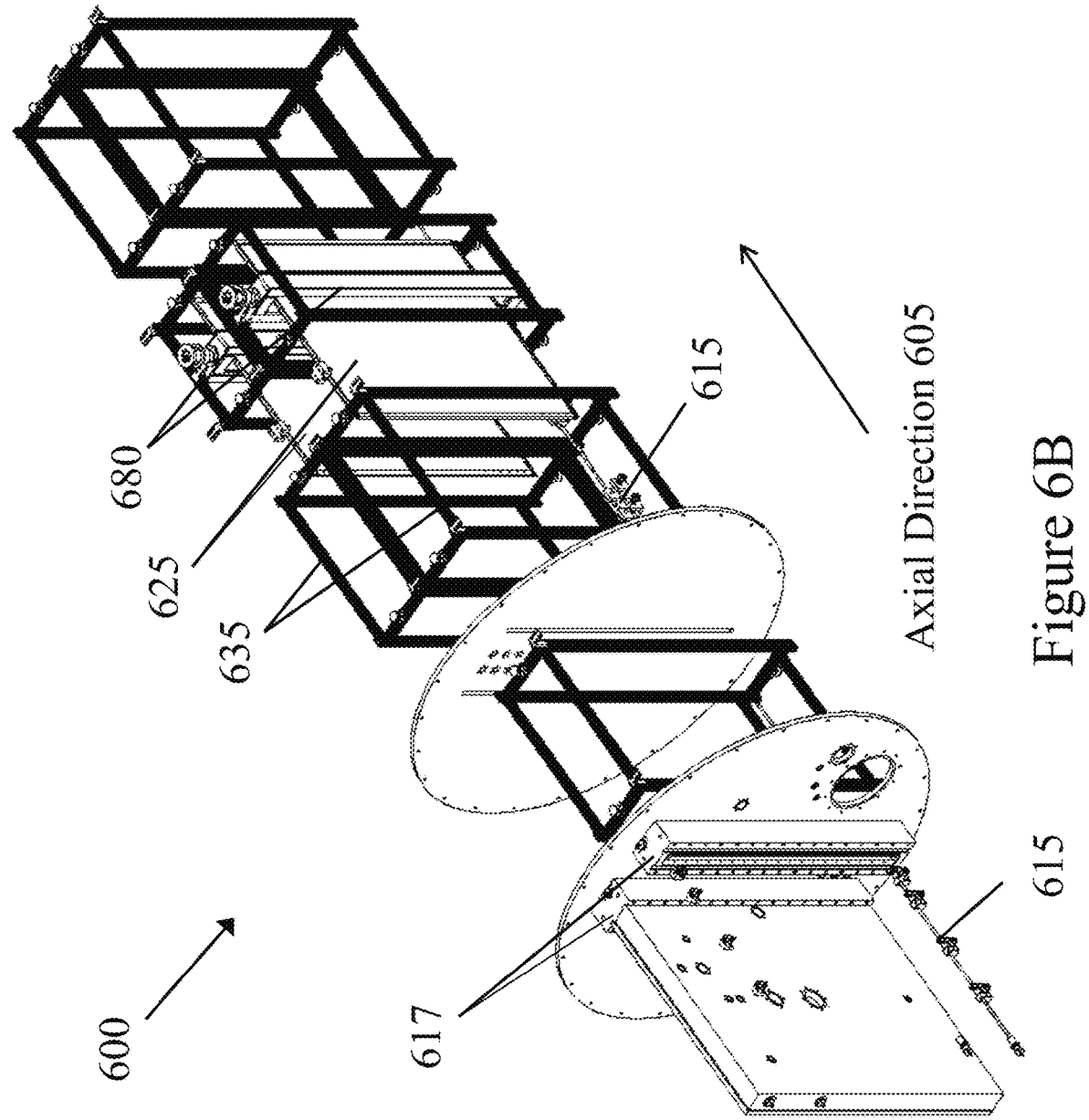
Figure 6C:
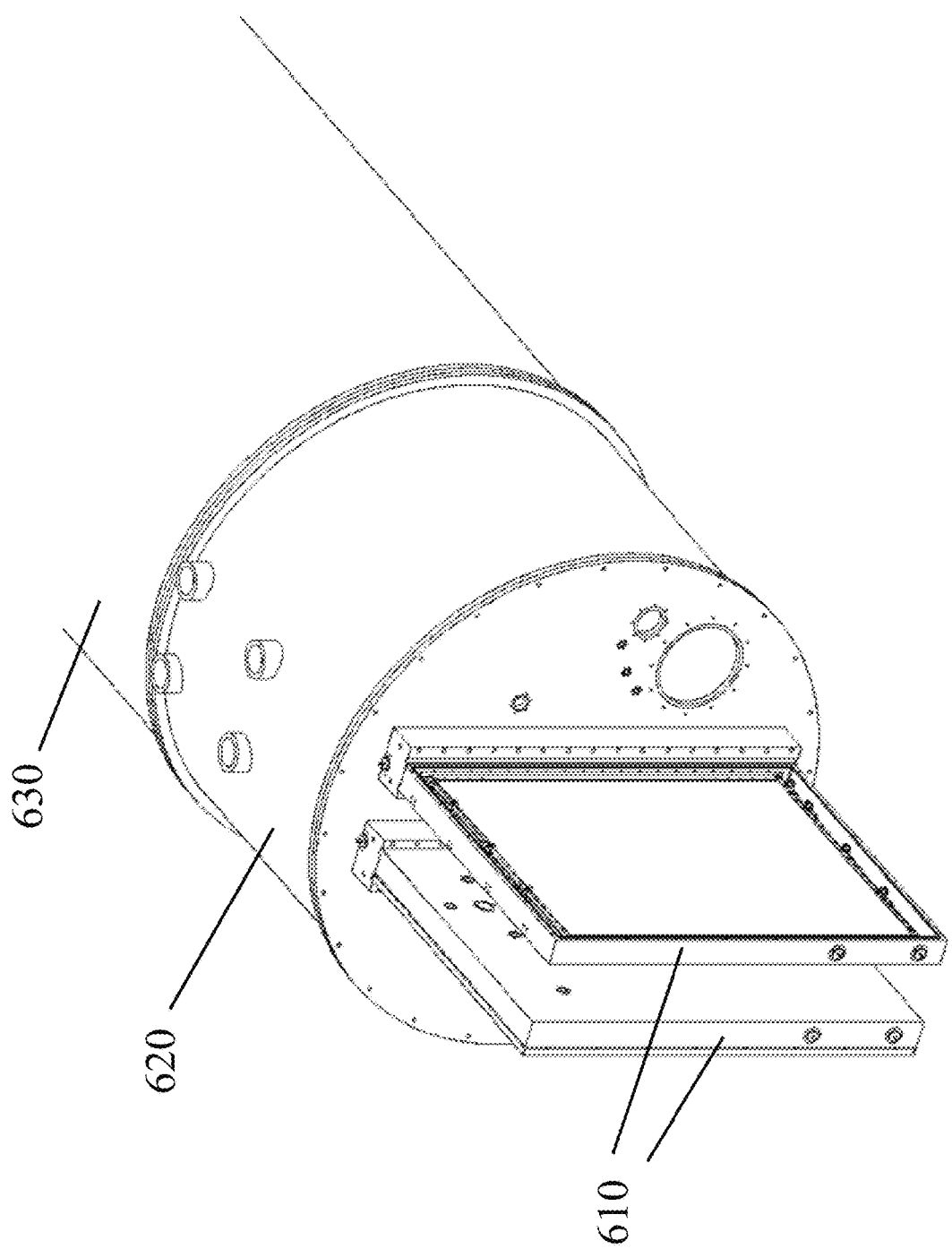
Figure 6D:
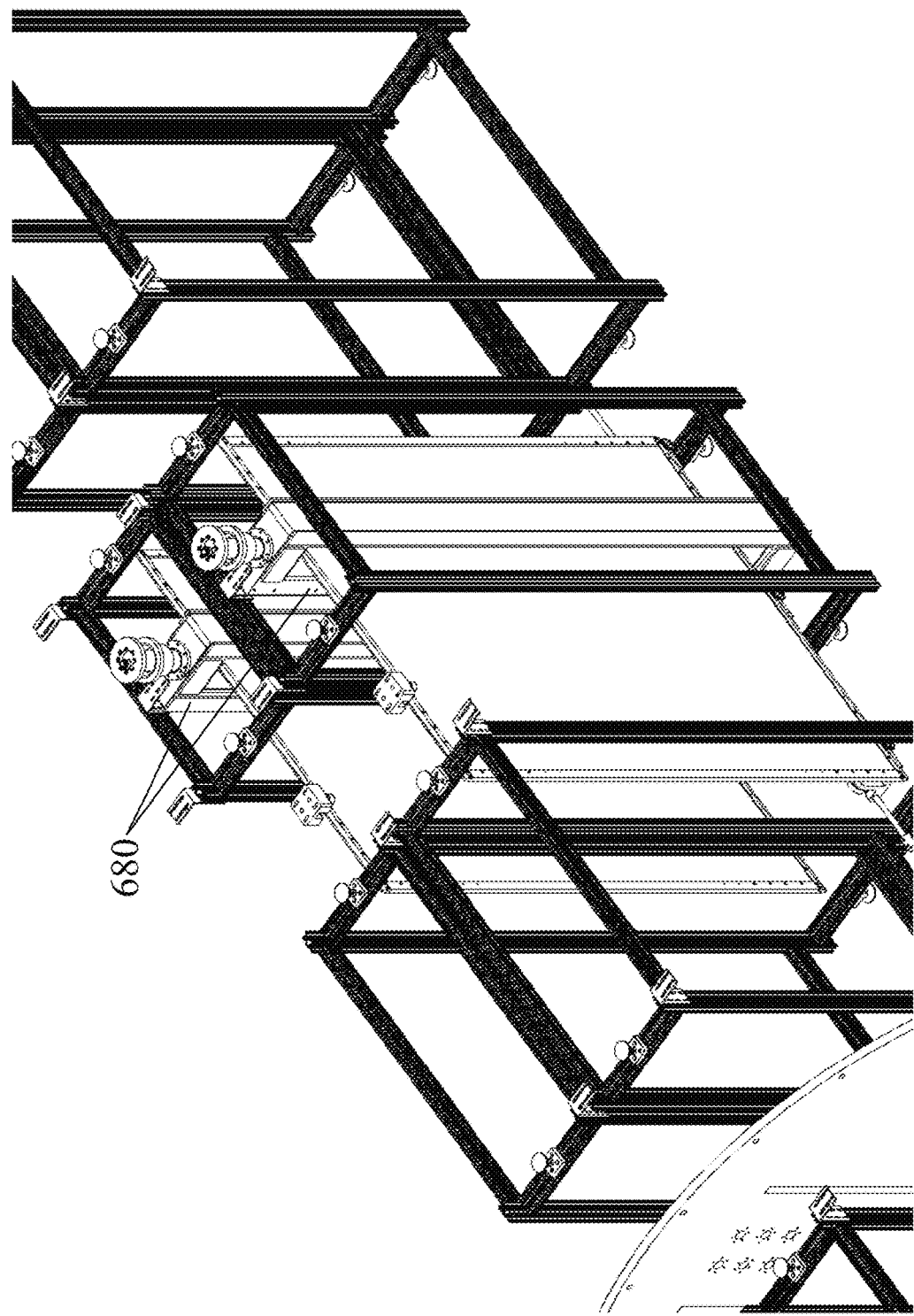

The cylindrical chambers can be connected together to form a vacuum deposition system with either cylindrical load locks or box shaped load lock. FIG. 6A shows the perspective view of such apparatus with individual box shaped load locks for each substrate carrier. A single load lock with multiple substrate carrier assemblies can also be used instead of individual load locks. The individual load locks can share same set of pumps and pressure measurement to save cost. Referring to FIGS. 6A-6D, a high throughput deposition apparatus 100 includes two entrance load lock chamber 610, an entrance buffer chamber 620, a first process chamber 630, a second process chamber 650, an exit buffer chamber 660, and two exit lock chamber 670. The high throughput deposition apparatus 600 also includes deposition sources 680. Referring to FIG. 6B, where the vacuum envelope is removed for clarity, the transport system 615 moves the substrate carrier assemblies 625 through gate valves 617 and deposition system 600. The deposition sources can include sputtering targets and magnets used for physical vapor deposition. The deposition sources can also produce vapor for chemical vapor deposition (CVD) or plasma enhanced chemical vapor deposition (PECVD). Only two rows of substrate carrier and two rows of deposition sources are illustrated here. Three or more rows of substrate carrier assemblies and deposition sources can be used in the present invention. The deposition sources and transport systems can be mounted in frames 635 that are attached to the cylindrical chambers. The frame can be made from either welded bars or plates or assembled from individual bars made by companies such as 80/20 Inc. in the United States. Box shaped vacuum chambers can also be used instead of cylindrical chambers, the frames 635 are not necessary in this case.

Deposition sources can be assembled in a close loop around the substrate carrier assemblies 625. The closed loop can define a plane substantially perpendicular to the axial direction 605 (FIG. 6B). Such deposition sources can enable better deposition uniformity and improve capturing efficiency of deposition materials on substrates. A closed loop deposition sources minimize the edge effects in sputtering, CVD, and PECVD, and increase deposition material utilization. In case of plasma enhanced deposition such as sputtering deposition and PECVD, a closed loop deposition sources allow electrons to travel in a closed loop with the aid of magnetic field and substantially increase operating plasma density and reduce operating pressure.

Figure 7A:
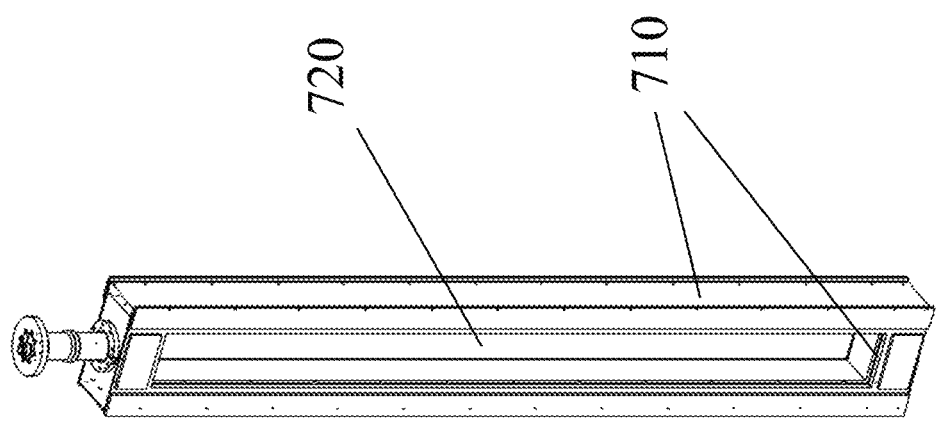
FIG. 7A illustrates a rectangular closed loop magnetron sputtering source that can be mounted inside a vacuum chamber.

FIG. 7A shows perspective view of a rectangular deposition source with 4 sputtering targets or 4 gas distribution plates used in CVD or PECVD. For sputtering deposition, more than 4 targets can be used to increase the angles between neighboring targets beyond 90 degrees and reduce re-deposition from neighboring target. For example, 2 long targets facing each other define a long dimension of the closed loop, and 6 short targets define a short dimension of the closed loop. The 3 short targets are positioned at each end as shown in FIG. 7D.

Figure 7B:
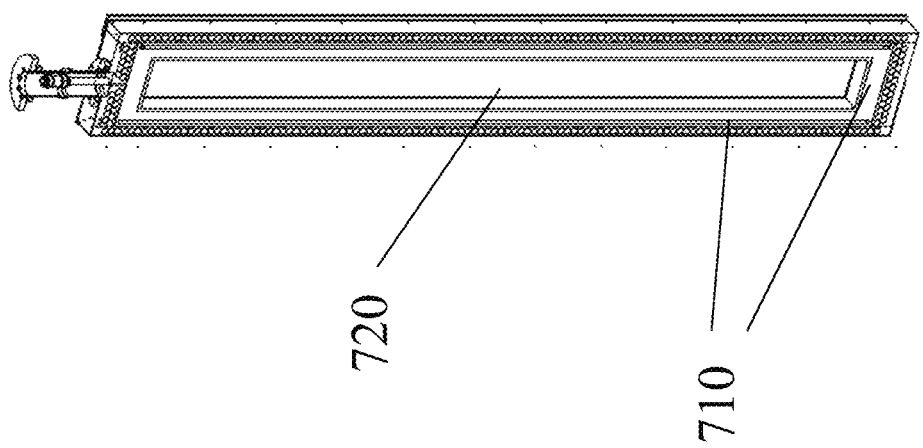
FIG. 7B illustrates the cross section of such source showing the closed loop targets and individual magnets.

Referring to FIGS. 7A and 7B, multiple targets or deposition sources 710 can be placed close to each other to form a substantially closed loop 720. Each target or deposition source 710 can have a substantially rectangular shape to decrease cost. The deposition sources 710 can be sputtering sources, sputtering targets, CVD or PECVD sources, heaters, or gas distribution plates. In some cases, the individual deposition sources 710 can be replaced by one or more integrated deposition sources, reducing the number of sources and system cost. The sputtering targets or deposition sources 710 can form a closed loop polygon with two long sputtering targets or deposition sources parallel to substrates they face.

A magnetic field by either electrical coil or permanent magnets can enhance plasma density, improves plasma uniformity and decrease operating pressure for sputtering, PECVD, or etching of the substrates. Electrons drift under Lawrence force and electrode voltage or target voltage and form a close loop over the closed loop target or deposition source surfaces. The plasma uniformity is better than conventional planar magnetrons where electrons have to make sharp turns near target ends to form a closed loop over the same planar or cylindrical source. A special case of closed loop is a rectangular closed loop, which takes a small volume and allows more sources to be installed inside a process chamber as illustrated in FIG. 7A.

Figure 7C:
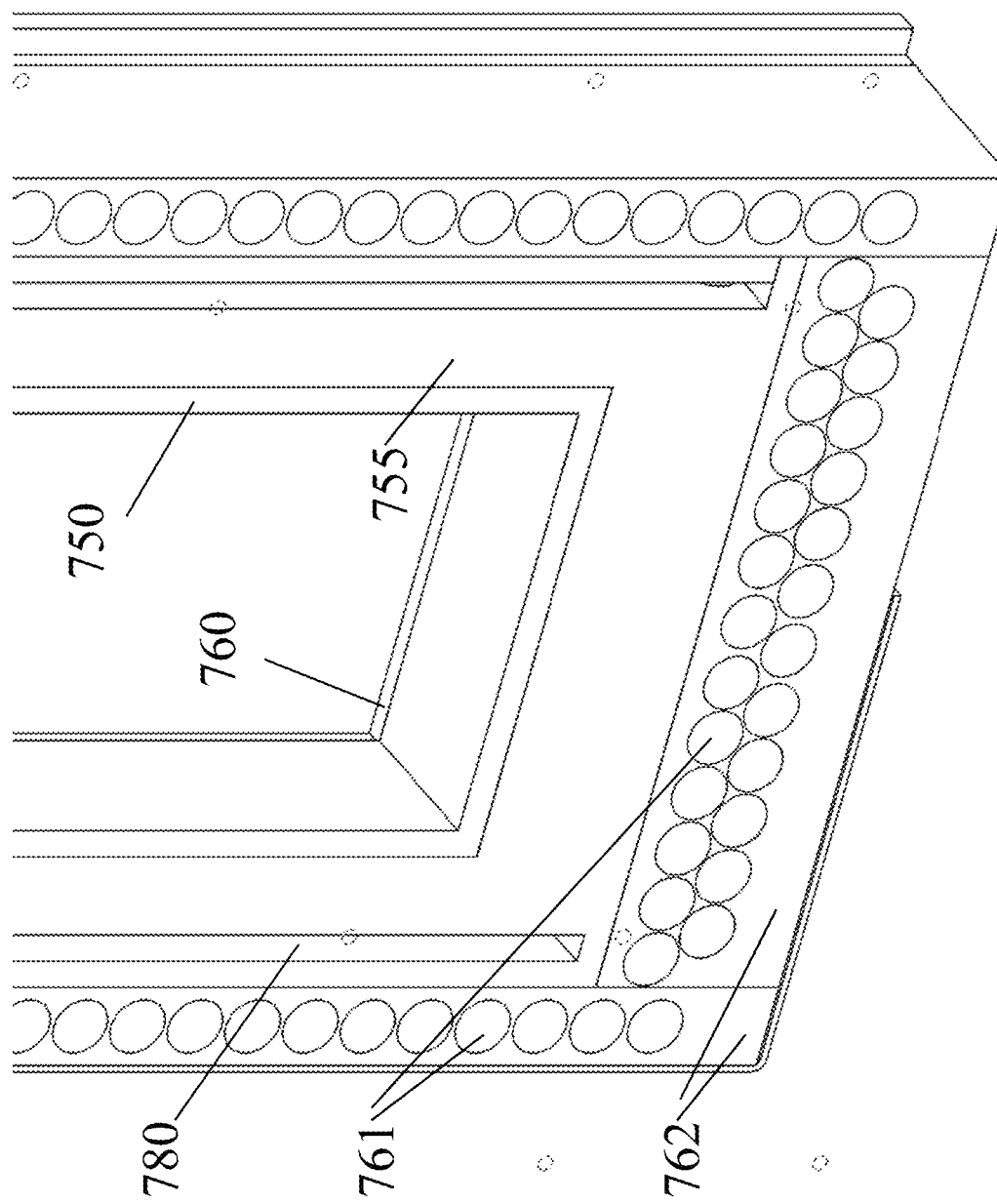
FIG. 7C shows the details of such source with cooling channel shown.
Figure 7D:
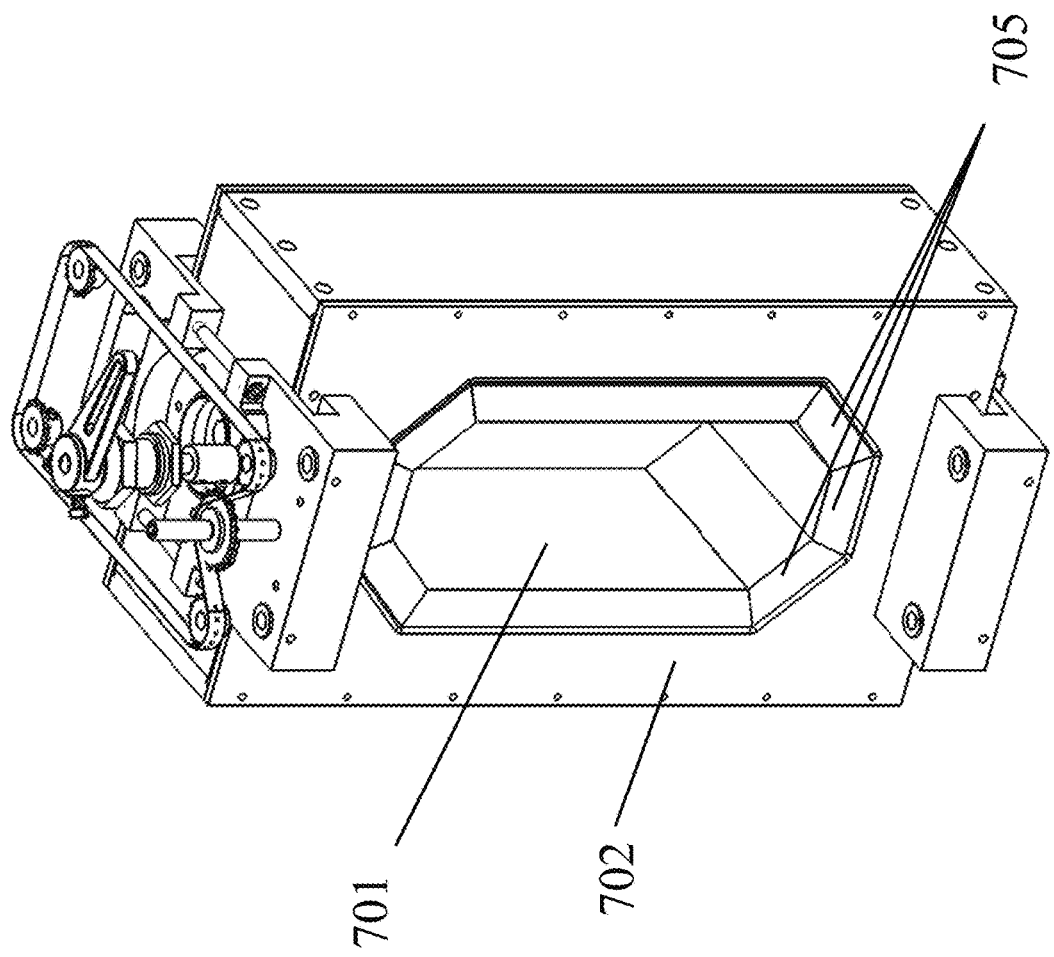
FIG. 7D shows 8 sided polygon sputtering source that enable closed loop plasma formation.

Referring to prospective sectional view of the plasma source in FIG. 7C, a deposition source 750 such as a sputtering target or a shower head in PECVD is mounted to a backing plate 755 with cooling channel 780. Magnets 761 are mounted either into the backing plate 755 or insulator 762 as shown to form a closed loop magnetic field. Anode plate 760 is mounted to the insulator 762 to provide a voltage bias to back plate 755 during operation.

Another special case of closed loop has two long facing target or showerhead surfaces 701 as illustrated in FIG. 7D. The rest of the polygon is made of 4, 5, 6 or more shorter planar target surfaces or shorter planar deposition source surfaces 705, as illustrated in FIG. 7D in which 2 long targets 701 and 6 planar shorter targets 705 are held by the backing plate (not shown). The anode shields 702 are electrically isolated from targets or shower heads 701 and 705. Yet another special case of closed loop is two long targets or deposition sources surfaces and end pieces that form curved surfaces.

Figure 7E:
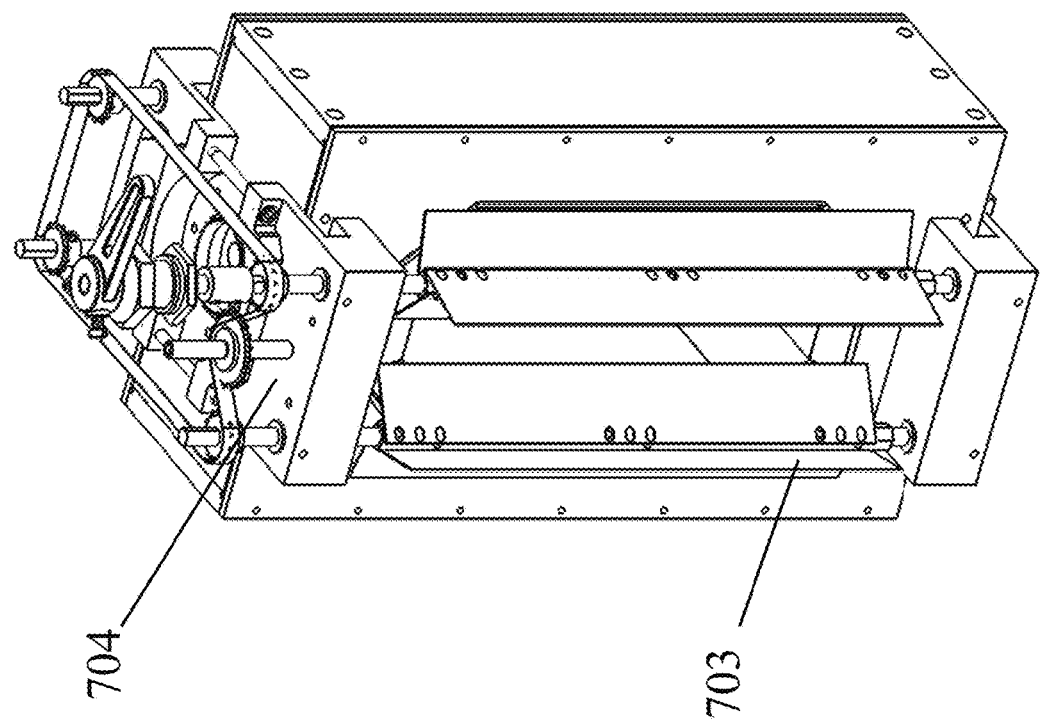
FIG. 7E shows optional clusters of shields placed just outside the deposition source in FIG. 7D, to reduce deposition on the vacuum chamber wall and also used to fine tune the deposition uniformity on substrates.
Figure 8:
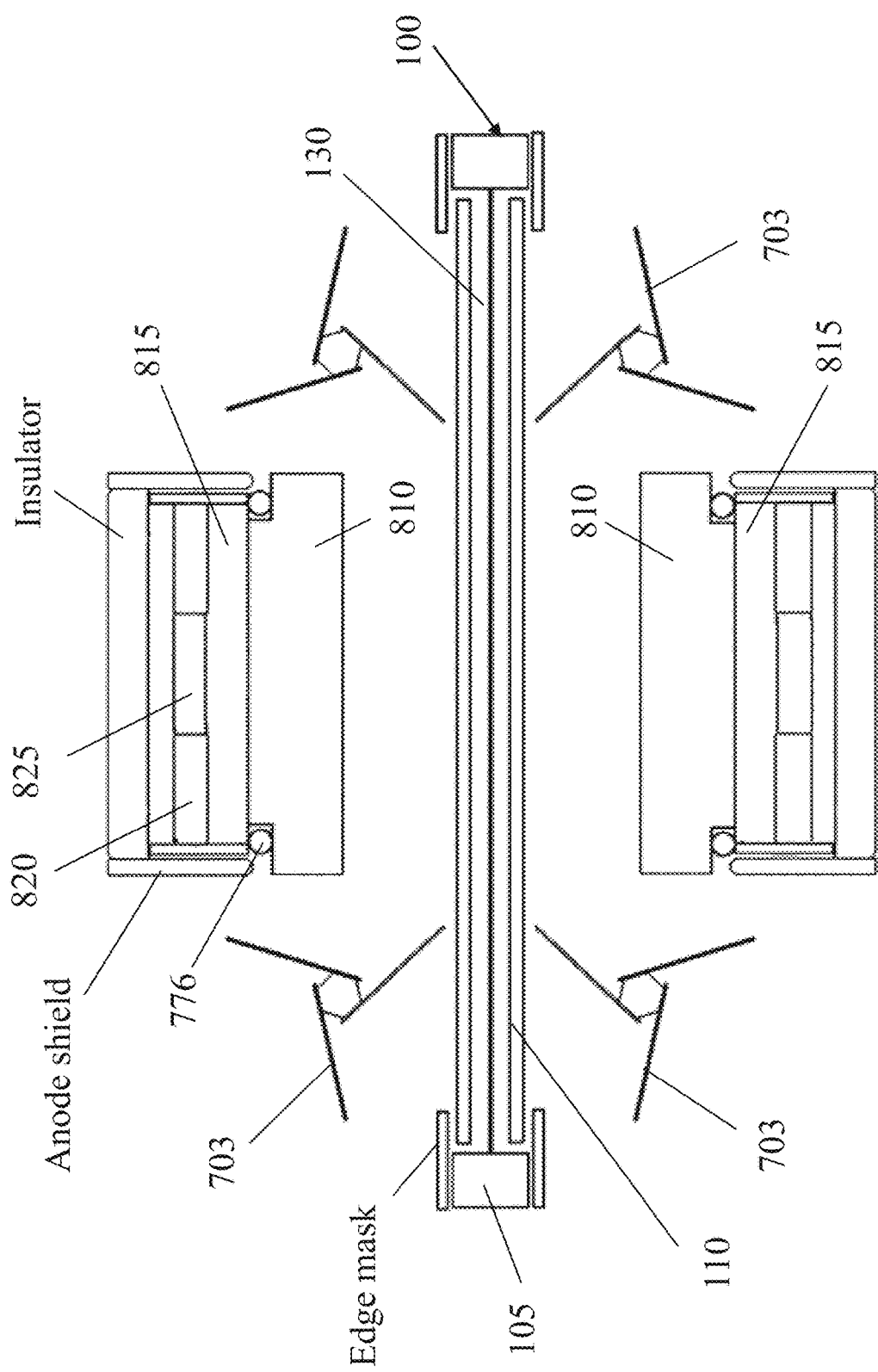
FIG. 8 shows cross section of sputtering source in FIG. 7E.

In FIG. 7E, a set of 2 to 4 shields 703 are mounted outside the deposition source, these shields 703 reduce deposition on the vacuum system and substrates and can be used to fine-tune the deposition uniformity on substrate by shaping the shield to vary the blocked area on substrates. Multiple shields 703 are mounted a shaft, which can be rotated by a rotation mechanism 704 so that different shields are facing the deposition source. The cluster of shields 703 can have different blockage area to compensate the uniformity change throughout the deposition source life time. FIG. 8 shows the cross section of the sputtering source of FIG. 7E, with two substrates mounted to a substrate carrier with heater and edge shadow mask.

Referring to FIG. 8, sputtering targets 810 are mounted to a liquid cooled backing plate 815 by either conventional bonding or mechanical force such as clamps or other targets 810 in the closed loop. Elastic seals 776 can be used to seal the space behind target 810 and gas can be used to pressurize this space and cool the targets 810. Our test data show over 10 Torr of pressure can be maintained while still keep the process chamber pressure below 0.0005 Torr for new targets. As the targets near end of life time, holes start appear in the target 810 and cause a change in back side pressure and the pressure decrease can be used to detect the end of life for target and increase target utilization. The saving in target bonding cost is also significant.

Figure 11A:
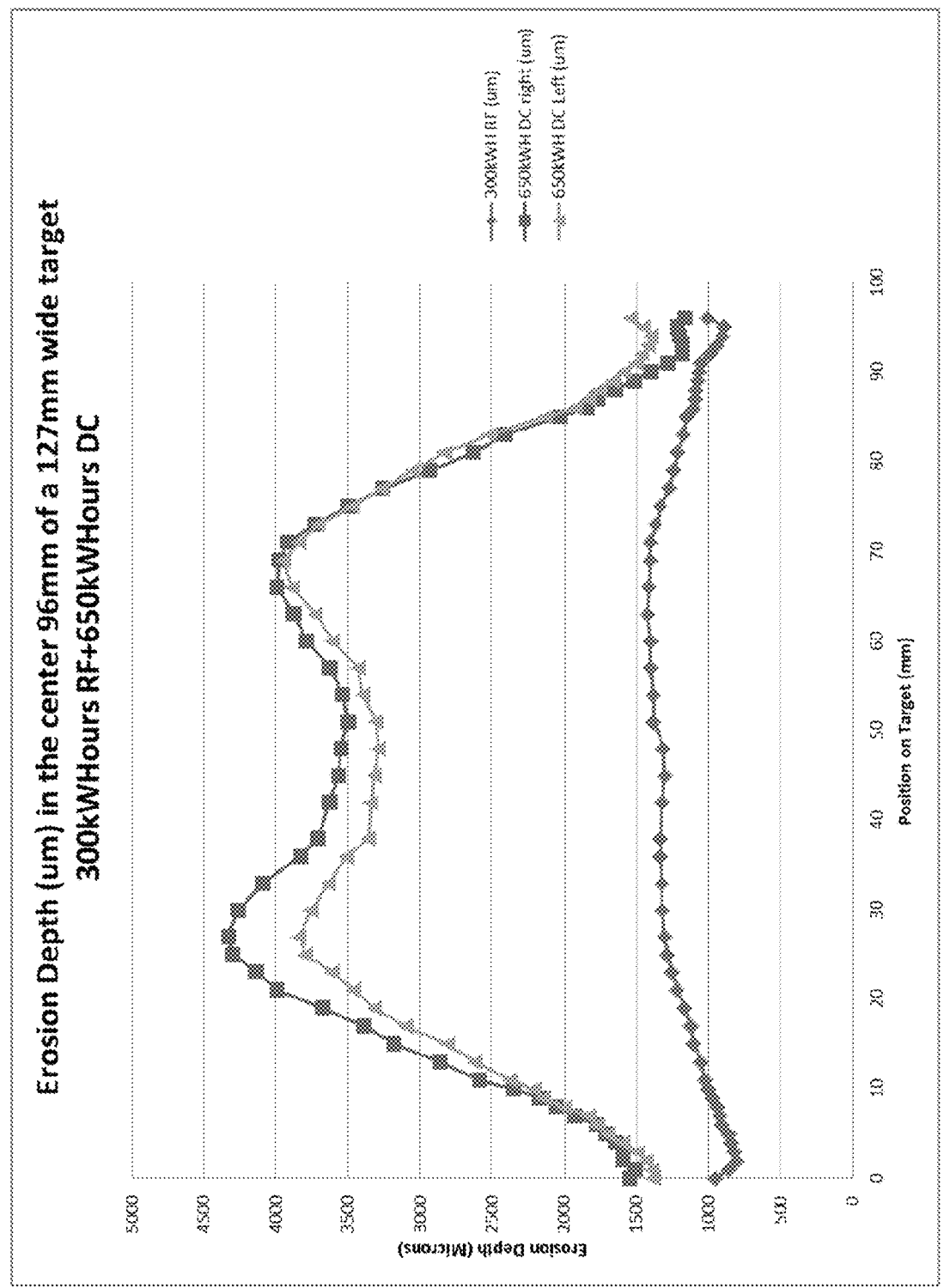
FIG. 11A shows the erosion profile after extended run across the width of the sputter target used in FIGS. 7D and 8.
Figure 12:
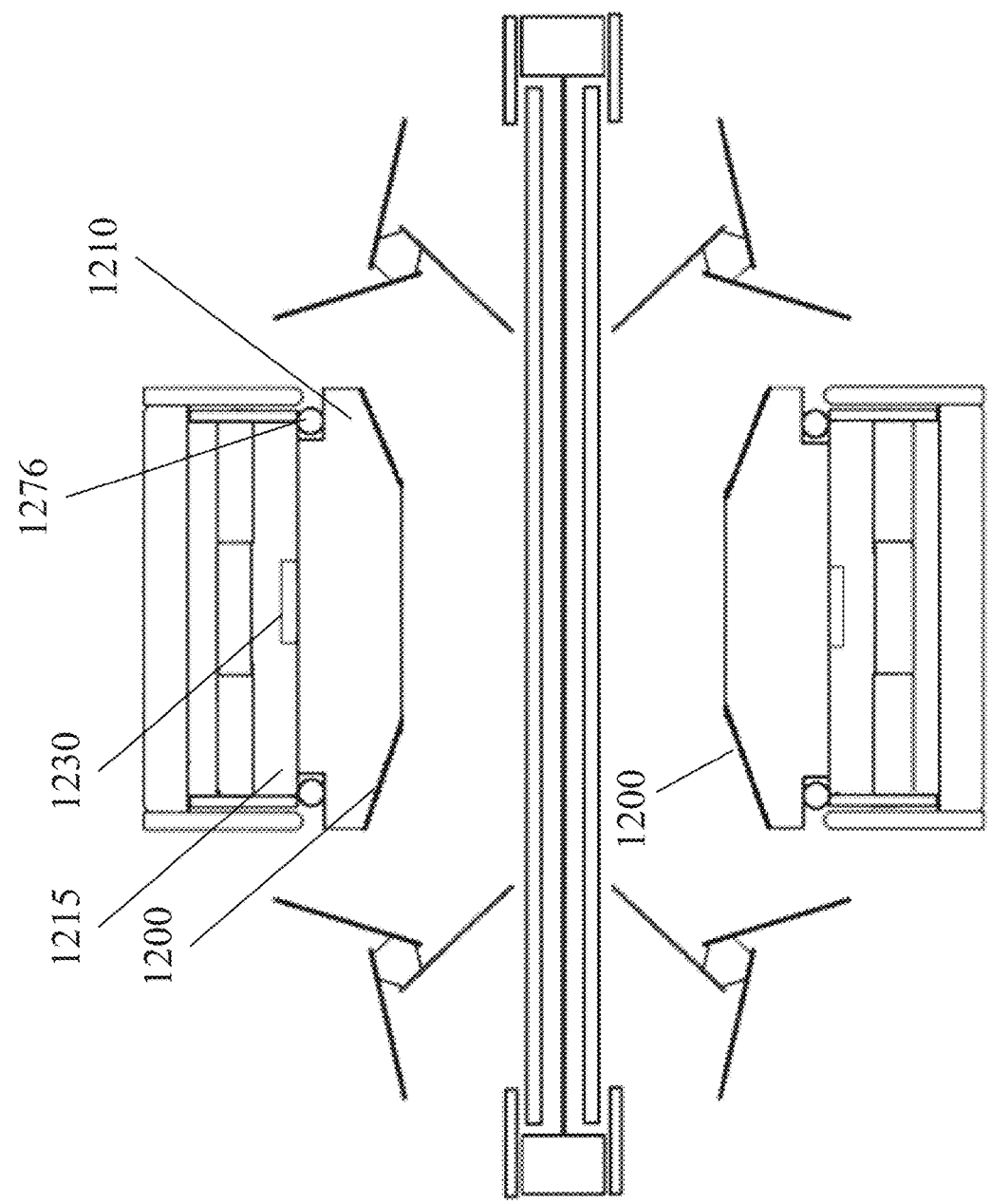
FIG. 12 shows the targets are tapered to increase sputtering rate and reduce initial material needed to increase target utilization.

Magnets 820 and optional paramagnetic materials used to extend the magnet field are placed behind the target 810 to form a close loop; the width of these permanent magnets should be less than the target width by at least 3 mm at each end. The shorter magnet width allows the anode shield to be placed behind targets and avoid direct deposition. The middle section of the magnets can be different from end magnets to optimize target utilization. In some case, the middle magnets 825 can be absent if the gap between the end magnets is small enough. This magnet field creates a substantial parallel magnet 820 near center portion of the target 810. FIG. 11A shows the target erosion near the center of the target 810 with approximately 80% target utilization. Near the target edge, the magnetic field starts to form larger angles from center target surface, and the target utilization decrease near target edge. An effective way to increase target utilization is to taper the target surface near the edge and reduce the target thickness at the edge. Not only the initial material is reduced but also the sputtering surface is more parallel to the magnetic field near taper edges 1200 and increase the sputtering rate of the target as shown in FIG. 12. Over 60% target utilization can be achieved.

Figure 11B:
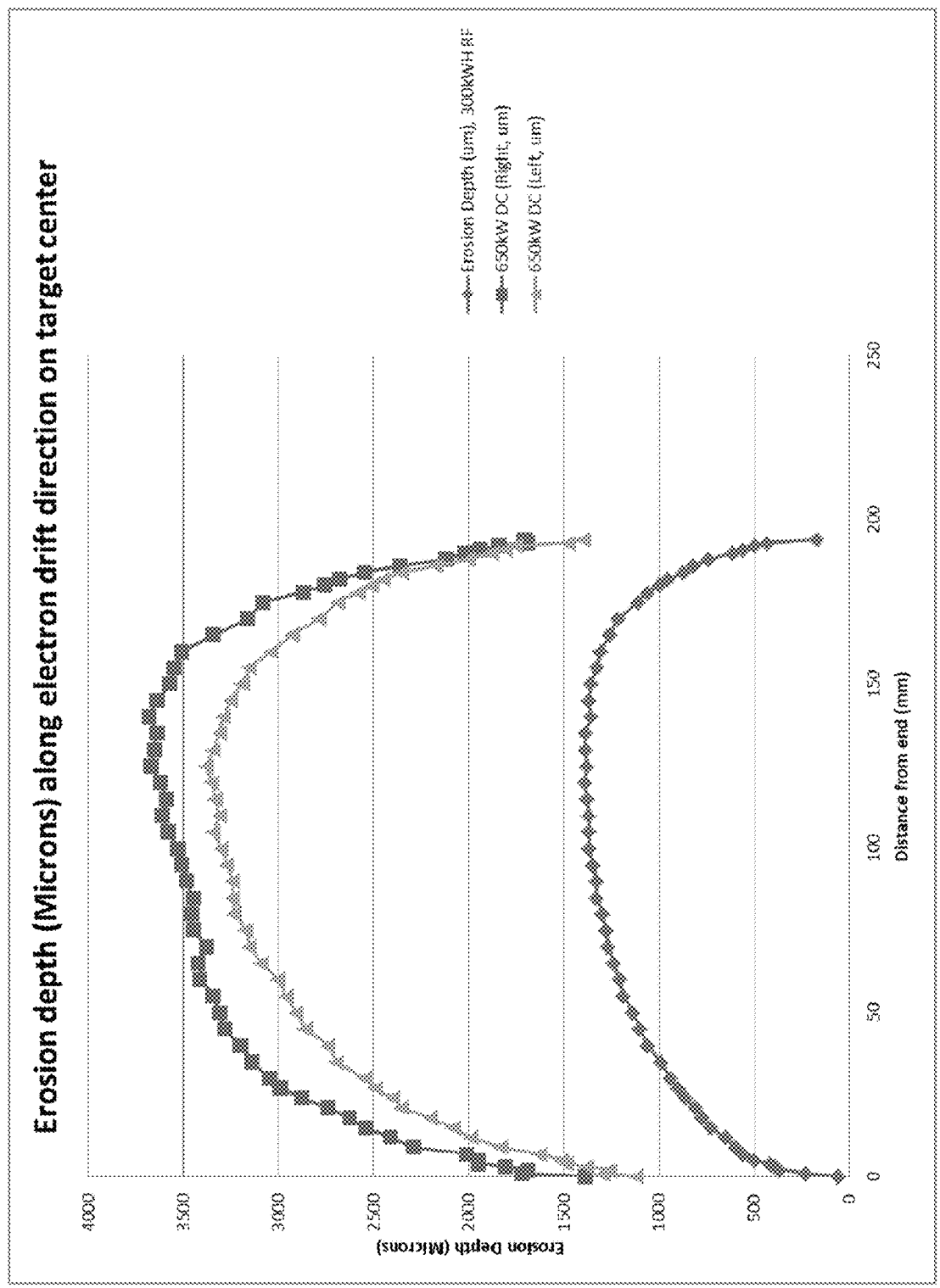
FIG. 11B shows the erosion profile after extended run across the length of the sputter target used in FIGS. 7D and 8.

As electrons drift along the closed loop sputtering or deposition source under confinement of magnetic force, electrons have to turn around near end of the closed loop and some electrons get lost. Our target erosion measurement after extended run shows a drop in target materials in one end of the target as shown in FIG. 11B. The effect is more pronounced using Radio Frequency (RF) sputtering at 13.56 MHz than DC sputtering. One method is to increase the magnetic strength under the low erosion region accordingly. Another method is to use two deposition sources for each layer of deposition, where the two deposition sources have opposite direction of magnetic force to reduce the non-uniformity effect. The gradual increase in sputtering rate along the electron drift path in FIG. 11B will be compensated by the gradual decrease in sputtering rate again the electron drift path in the second sputtering source with opposite direction of magnetic field and hence the opposite direction of electron drift. The decrease in erosion rate near the end of the targets is caused by re-deposition from neighboring targets.

To prevent deposition onto the chamber body, multiple rotatable shields can be installed around the deposition source. FIG. 7E shows such configuration and FIG. 8 show the sectional view when viewed from the top. Most deposition can be blocked by the blocking plates. By rotating the blocking plate, the deposition can be spread over both sides of all blocking plates and increase time between shield changes. One other use of the blocking plates is to adjust the deposition thickness on substrate; one or more blocking plates can be inserted close to each substrate and near the deposition source. By changing the shape of the blocking plate, different amount of materials can be blocked from the substrates until good uniformity is achieved. Multiple blocking plates can be mounted to a rotatable bar; different blocking plate can be rotated into position at different target lifetime to adjust the uniformity to account for the changes in deposition distribution. These rotatable bars can be linked by a chain or belt to an external motor or manual rotation device.

In a sputtering system, shields are placed around sputtering targets to prevent deposition on deposition chambers and collect deposition materials. These shields have to be replaced to prevent excess material build up and particulate formation. Since most of sputtered material in a closed loop target arrangement reach either the substrates or the opposing and neighboring target, the deposition onto the shield is much less. To further reduce the re-deposition on the anode shield, the anode shield can be hidden behind the target as shown in FIG. 8. The anode shields see no direct deposition from target surfaces and only scattered deposition materials. We have found the deposition on the anode shield is less than 5% of that on the substrates. There is direct deposition on chamber shields, but the thickness is less due to large distance between sputtering source and the chamber shields. The reduced deposition on various shields can greatly increase the time interval between system maintenance and increase system uptime.

Referring to FIG. 12. Since the targets are mechanically supported by each other, target bonding to the backing plate 1215 is optional and significant cost saving can be achieved. To improve heat transfer between target and backing plate 1215, which is typically cooled by circulating coolant, gases such as processing gas, Argon or helium can be filled in cooling channels 1230 between target and backing plate 1215. Optional sealing such as O-ring 1276 can be used between the target 1210 and the backing plate 1215, to further build up the pressure behind targets and improve heat transfer. The gas flow and pressure behind targets can be monitored as the target is being sputtered away, as one of the target reach end of its life, a small hole will form on the target and cause the pressure to decrease quickly. The pressure drop can be used to indicate the end of life and maximum target utilization can be achieved.

In some cases, very thick targets are used to extend the lifetime of sputtering source; the side of the targets extrude beyond anode shields and are exposed to plasma.

Figure 9A:
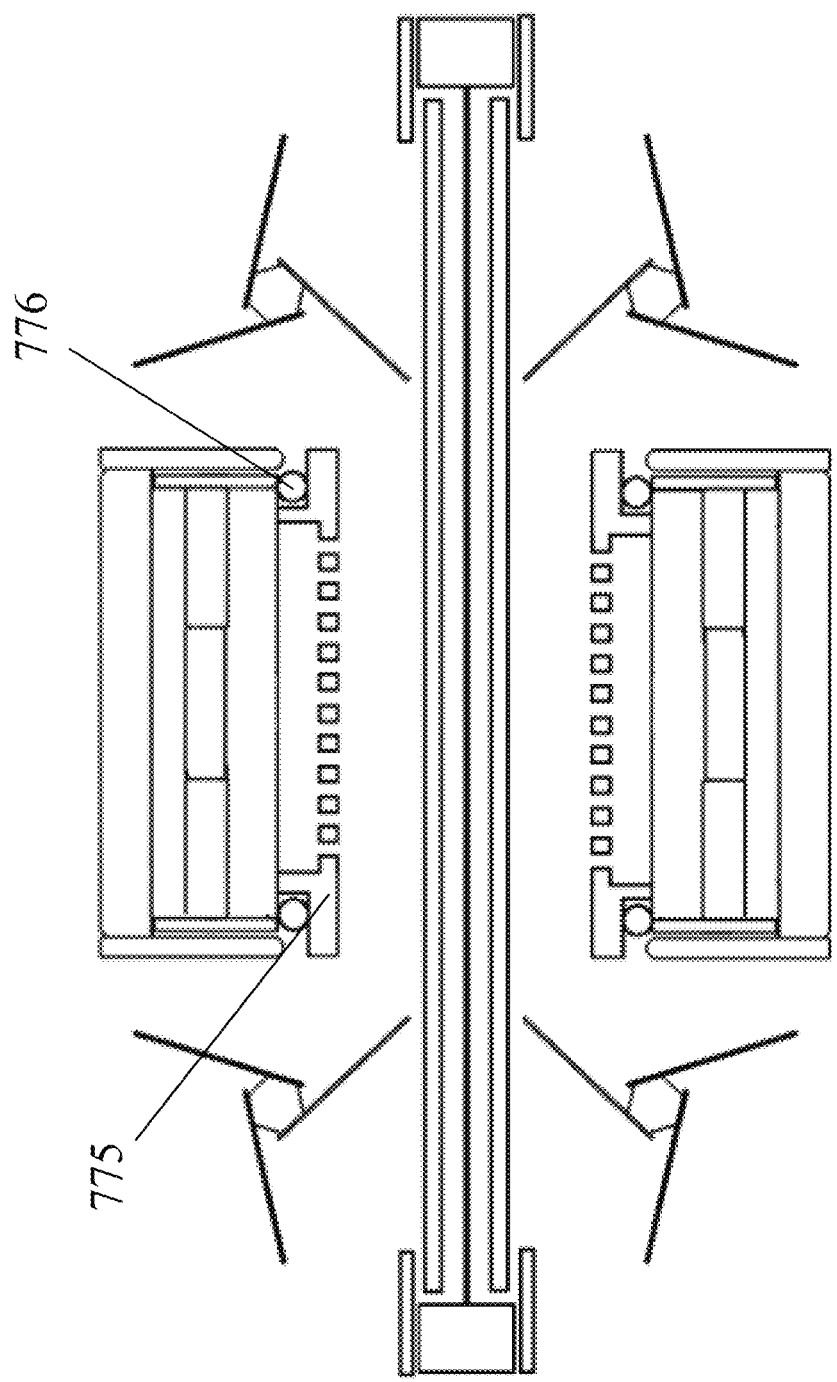
FIGS. 9A and 9B show the cross section of PECVD source where the targets in FIG. 8 are replaced by gas distribution plates.
Figure 9B:
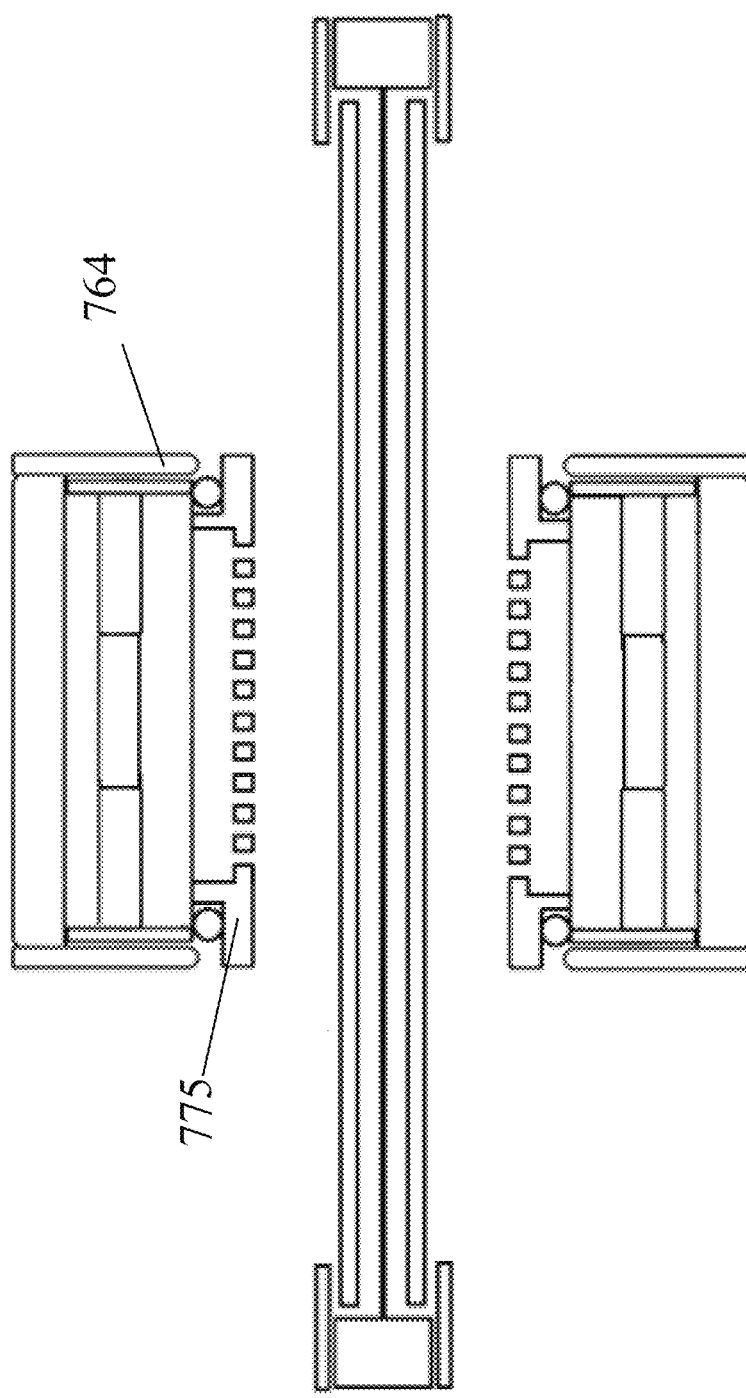

The magnet loop can be scanned across a much larger deposition surface to further improve the average plasma uniformity, increase size of the target and increase target material utilization in case of sputtering, as shown in FIG. 9A. An electrical conductive coil can also replace the fixed magnets to increase the plasma area, as shown in FIG. 9B. An enhanced plasma density by trapping energetic electrons in a closed loop can lower operating pressure of PECVD, reduce gas phase reaction and greatly increase PECVD gas utilization. The lower pressure of magnetic field enhanced PECVD also widen the process window, increase energy of individual atoms or molecules, and improve material properties. The CVD or PECVD deposition sources include at least a pair of deposition sources opposing each other.

Figure 10A:
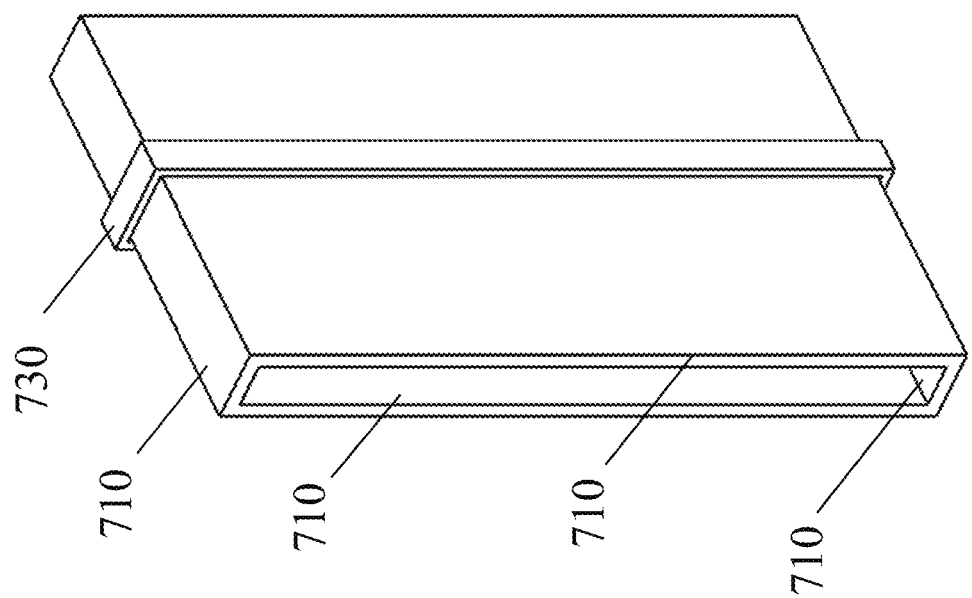
FIG. 10A shows a closed loop rectangular targets with a narrower closed loop magnetron that can scan the target surface to increase size of sputtering target and increase target material utilization.

Referring to FIG. 10A, a permanent magnet loop 730 is scanned behind the deposition sources 710, it provides a uniform average magnetic field around target surfaces after scanning, and uniform target material consumption in most target areas, which increases target utilization.

Figure 10B:
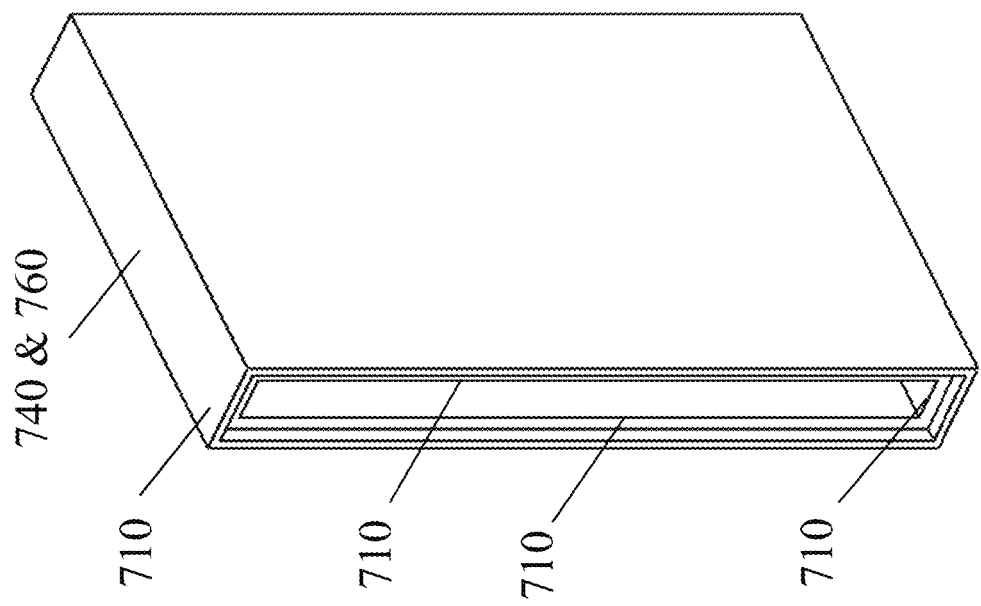
FIG. 10B shows a closed loop rectangular targets or shower heads surrounded by electrically conductive coil forming an electro-magnet to enhance the plasma density.

Alternatively, referring to FIG. 10B, an electrical coil 740 (not shown in FIG. 10B, shown in FIG. 13A) inside a cooling enclosure 760 provides the magnetic field, electrons travel in a loop and form uniform plasma near the surfaces of the deposition sources 710. This uniform plasma can improve sputtering target utilization or PECVD uniformity. The magnetic flux is substantially parallel to the target or shower head surface, and a large plasma area is formed. The reduced plasma heating per unit area can allow higher deposition rate and reduced target temperature in sputtering.

Figure 13A:
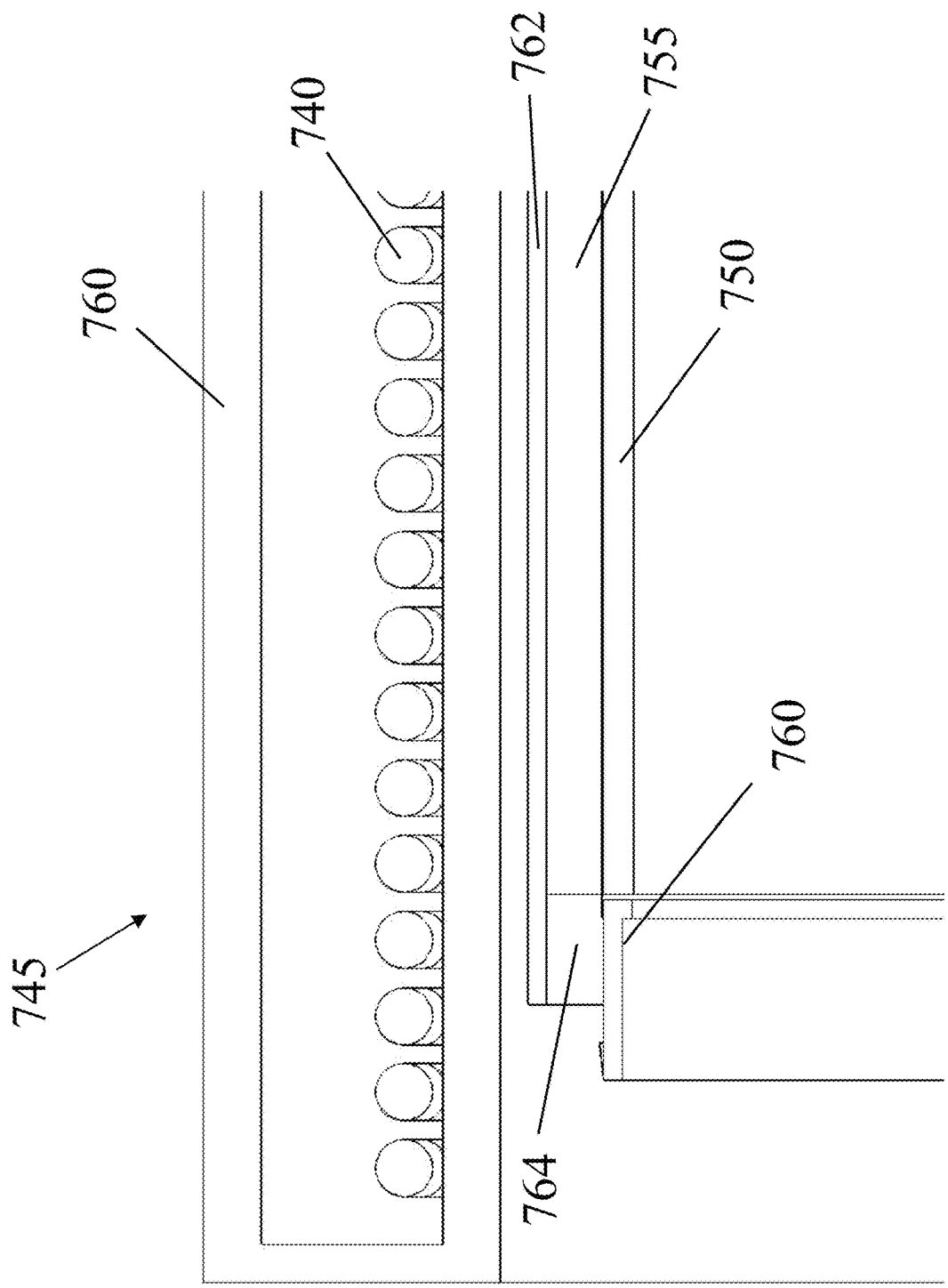
FIG. 13A shows the cross section of electro magnet and sputtering target in FIG. 10B.

FIG. 13A shows the cross section of FIG. 10B, a detailed design of a PVD source 745 comprising a target 750, a backing plate 755, anode shields 760, a backing plate insulator 762, and side insulators 764, and electrical coils 740 in a cooling container 760. In case of scanning permanent magnet sputtering as shown in FIG. 10A, the electrical coils 740 and its cooling container 760 are removed, a closed loop permanent magnets that form at least a component parallel magnet field is placed behind the target 750 and backing plate 755.

In a PECVD source 770, the targets 750 are replaced by shower heads 778 as shown in FIG. 10B, where incoming process gases are fed to the gas distribution plate 775 to minimize impact of flow differentials between inlet and more distant locations. A shower head 778 further evens out the flow rate and provide an electrode for plasma formation. The backing plate insulator 762 and the side insulator 764 confine plasma to the shower head region. The electrical coil 740 is optional and can increase plasma density and lower the operating pressure.

Figure 13B:
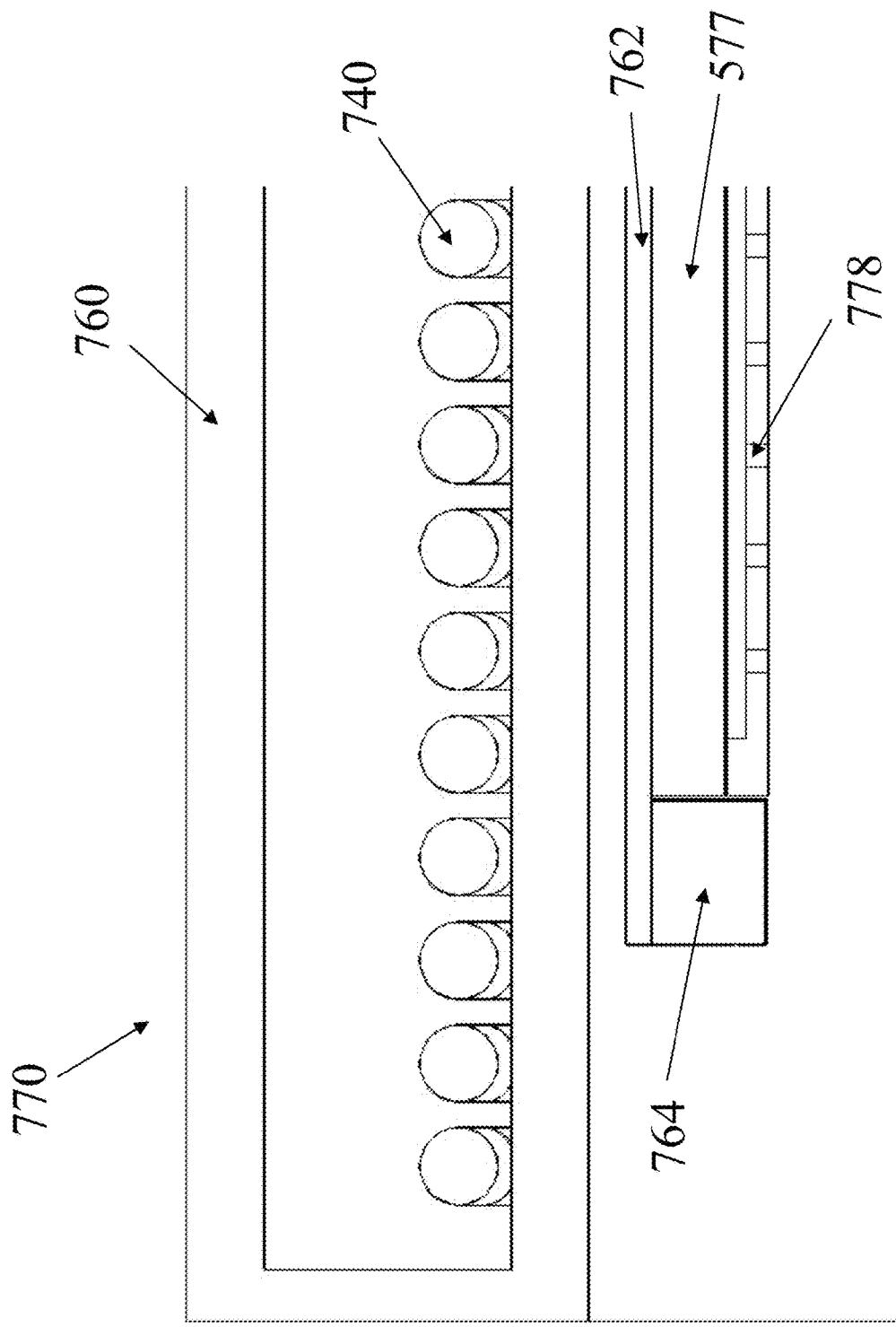
FIG. 13B shows the CVD or PECVD deposition source cross section in FIG. 10B.

Permanent magnets can also replace electrical coil 740 in FIG. 13B to form a closed loop magnetic field. FIGS. 9A and 9B show the cross sections of closed loop deposition source in FIGS. 7E and 7D where the sputter target is replaced with gas distribution plates. Optional seal and optional deposition shields and elastic seal 776 are shown in FIG. 9A.

In a continuous moving deposition system, referring back to FIGS. 6A-6D, one or more substrate carrier assemblies can be mounted in entrance load lock, pumped down, moved to an optional entrance buffer chamber where substrates can be heated or cleaned, moved to a larger process chamber where the carrier assemblies start a constant speed movement through deposition sources, and then convert back to discrete movement through optional process buffer chambers, and then move continuous through more process chambers if different process or/and process environment are required. The carrier assemblies are then moved through an optional exit buffer chambers and exit load lock where the carrier assemblies are moved out after venting. Individual carrier movement is translated from discrete loading into continuous movement during deposition. The optional buffer chambers provide vacuum or process isolations between chambers to reduce cross-contaminations, and serves as staging area between gate valves to facilitate discrete movement to clear gate valves and continuous movement for processing.

Most materials leaving the deposition sources are deposited on substrate carrier assemblies and its shields which can be cleaned outside the vacuum system, other deposition sources which can be re-sputtered in case of sputtering or chemical cleaned in case of CVD, or various anode shields.

In the case of sputtering using scanning magnetron as shown in FIG. 10A, or static magnet configuration shown in FIG. 8, there is only one magnet loop required. The sputtering erosion region can be wide by using wider magnet and has minimum impact on material utilization if a wide target is also used. The magnetic field strength can be quite strong and a much thicker target can be used compared with conventional planar or rotary targets. The thicker and wider target reduces the frequency to replace the target. Electrical magnets allow even thicker targets. Combined with reduction in deposition on the deposition chamber surface or deposition shield, the system down time due to target changes and shield changes is also greatly reduced. In addition, the maintenance labor and cost such as target changes, recalibration and system qualification, system burn-in and wasted substrates are reduced. A large plasma area combined with stronger magnetic field achievable in the present invention will lower the voltage on sputtering target or shower head, reducing the damages caused by energetic ions and electrons.

Only a few examples and implementations are described. Other implementations, variations, modifications and enhancements to the described examples and implementations may be made without deviating from the spirit of the present invention. For example, the disclosed deposition apparatus are compatible with other spatial configurations for the substrate, the deposition source, and substrate movement directions than the examples provided above. In CVD or PECVD applications, a magnetic field is optional.

In summary, the disclosed system can include one or more of the following features:
1. Targets and magnets placed in closed loops with two long targets or gas distribution plates parallel to the deposition surfaces of the substrates.
2. Both edges of the closed loops are made of curved or tapered surface to reduce the re-deposition from neighboring targets.
3. The magnets placed behind the target should be shorter than the target width. The strength of the magnetic field in the middle part of the target can be different than that in the edge portions for better target utilization.
4. The target edges should be tapered to further increase the target utilization.
5. The targets do not have to be bonded; they can be mechanically clamped together in the closed loop.
6. Elastic seal and gas can be used to cool the target surface and monitor the end of life time for target.
7. The anode shield can be placed behind targets to reduce deposition thickness and improves time between maintenance.
8. Cluster of shields can be used to reduce deposition onto the chamber and to tune uniformity on substrates. The shields can be rotated and switched.
9. Deposition sources can be used in pairs with opposite direction of magnetic field to minimize the effect of non-uniform electron drift.
10. Substrates can be mounted back to back on optional heaters.
11. Deposition sources can be mounted from inside vacuum chamber. Multiple rows of deposition sources can installed in a system.
12. Cylindrical vacuum envelope can be used.
13. Substrates can sit on soft cushion to reduce breakage.

What is claimed is:

1. A high throughput deposition apparatus, comprising:
   a process chamber;
   a plurality of targets that form a first closed loop in the process chamber, wherein the first closed loop includes a long dimension defined by at least a first pair of targets and a short dimension defined by at least a second pair of targets;
   a plurality of magnets positioned surrounding and concentric with the first closed loop of the plurality of targets;
   a first substrate carrier assembly configured to hold one or more substrates and configured to receive a deposition material from the plurality of targets in the first closed loop; and
   a transport mechanism configured to move the first substrate carrier assembly along an axial direction through the first closed loop in the first process chamber.

2. The high throughput deposition apparatus of claim 1, wherein the targets have tapered shape along an edge along the first closed loop.

3. The high throughput deposition apparatus of claim 1, wherein the one or more of substrates have one or more planar deposition surfaces configured to receive the deposition material, wherein the one or more planar deposition surfaces are parallel to the long dimension of the first closed loop.

4. The high throughput deposition apparatus of claim 1, wherein the first substrate carrier assembly comprises:
   a plurality of clamps; and
   a pair of substrates that are clamped back-to-back by the plurality of clamps, wherein the pair of substrates comprise opposing surfaces configured to receive the deposition material from the plurality of targets in the first closed loop.

5. The high throughput deposition apparatus of claim 1, wherein the first substrate carrier assembly comprises:
   a heater plate configured to heat the one or more substrates.

6. The high throughput deposition apparatus of claim 1, wherein the first substrate carrier assembly comprises:
   a first substrate comprising opposing surfaces configured to receive the deposition material from the plurality of targets in the first closed loop.

7. The high throughput deposition apparatus of claim 1, wherein the transport mechanism includes:
   wheels mounted under the first substrate carrier assembly and configured to roll the first substrate carrier assembly along the axial direction.

8. The high throughput deposition apparatus of claim 7, wherein the first substrate carrier assembly further comprises a cushion material under the one or more of substrates and over the wheels.

9. The high throughput deposition apparatus of claim 1, wherein the first closed loop defines a plane that is perpendicular to the axial direction.

10. The high throughput deposition apparatus of claim 1, further comprising:
   a plurality of targets that form a second closed loop in the process chamber, wherein the second closed loop includes a long dimension defined by at least a third pair of targets and a short dimension defined by at least a fourth pair of targets; and
   a second substrate carrier assembly configured to hold a single or a plurality of substrates and configured to receive a deposition material from the plurality of targets in the first closed loop,
   wherein the transport mechanism is configured to move the second substrate carrier assembly along the axial direction through the second closed loop in the first process chamber.

11. The high throughput deposition apparatus of claim 10, wherein the second substrate carrier assembly comprises:
   a plurality of clamps; and
   a pair of substrates that are clamped back-to-back to by the plurality of clamps.

12. The high throughput deposition apparatus of claim 1, further comprising:
   a cluster of deposition shields mounted on a shaft positioned adjacent to the plurality of targets in the first closed loop in the process chamber, wherein only a subset of the deposition shields in the cluster is exposed to deposition material from the plurality of targets in the first closed loop; and
   a rotation mechanism configured to rotate the shaft to allow different one of deposition shields in the cluster to block a portion of the deposition material from the plurality of targets.

13. The high throughput deposition apparatus of claim 1, further comprising:
   a plurality of magnets that form a third closed loop in the process chamber,
   wherein the third closed loop of the plurality of magnets is positioned surrounding the first closed loop formed by a plurality of targets.

14. The high throughput deposition apparatus of claim 1, further comprising:
   a backing plate as part of a deposition source comprising the plurality of targets;
   at least one elastic seal between the backing plate and the plurality of targets; and
   a channel between the plurality of targets and the backing plate, the channel configured to transport gas to cool the plurality of targets.

15. The high throughput deposition apparatus of claim 1, wherein the first closed loop includes six or more targets in the first closed loop, wherein at least two adjacent targets in the first loop joint an angle higher than 90 degrees.

16. The high throughput deposition apparatus of claim 15, wherein the first closed loop includes eight targets that form an octagon in the first closed loop.

* * * * *